US010121325B2

(12) United States Patent
Hoffman et al.

(10) Patent No.: US 10,121,325 B2
(45) Date of Patent: Nov. 6, 2018

(54) GAMING SYSTEM AND METHOD PROVIDING ADJUSTABLE ODDS FOR TRIGGERING A GROUP BONUS EVENT

(71) Applicant: IGT, Las Vegas, NV (US)

(72) Inventors: Benjamin C. Hoffman, Reno, NV (US); Paulina Rodgers, Reno, NV (US); Christmas C. Parker, Reno, NV (US); Robert F. Lester, Reno, NV (US)

(73) Assignee: IGT, Las Vegas, NV (US)

( * ) Notice: Subject to any disclaimer, the term of this patent is extended or adjusted under 35 U.S.C. 154(b) by 0 days.

(21) Appl. No.: 15/864,868

(22) Filed: Jan. 8, 2018

(65) Prior Publication Data

US 2018/0130311 A1 May 10, 2018

Related U.S. Application Data

(60) Division of application No. 14/676,505, filed on Apr. 1, 2015, now Pat. No. 9,865,134, which is a continuation of application No. 12/473,493, filed on May 28, 2009, now Pat. No. 9,129,481.

(60) Provisional application No. 61/061,328, filed on Jun. 13, 2008.

(51) Int. Cl.
*A63F 13/00* (2014.01)
*G07F 17/32* (2006.01)

(52) U.S. Cl.
CPC .......... *G07F 17/3274* (2013.01); *G07F 17/32* (2013.01); *G07F 17/3244* (2013.01); *G07F 17/3267* (2013.01); *H05K 999/99* (2013.01)

(58) Field of Classification Search
CPC .. G07F 17/3274; G07F 17/32; G07F 17/3244; G07F 17/3267
USPC .......................................................... 463/25
See application file for complete search history.

(56) References Cited

U.S. PATENT DOCUMENTS

| | | | |
|---|---|---|---|
| 5,116,055 | A | 5/1992 | Tracy |
| 5,393,057 | A | 2/1995 | Marnell, II |
| 5,524,888 | A | 6/1996 | Heidel |
| 5,560,603 | A | 10/1996 | Seelig et al. |
| 5,564,700 | A | 10/1996 | Celona |
| 5,655,961 | A | 8/1997 | Acres et al. |
| 5,664,998 | A | 9/1997 | Seelig et al. |
| 5,711,525 | A | 1/1998 | Breeding |
| 5,816,918 | A | 10/1998 | Kelly et al. |
| 5,833,537 | A | 11/1998 | Barrie |

(Continued)

FOREIGN PATENT DOCUMENTS

| | | |
|---|---|---|
| WO | WO 2007/030632 | 3/2007 |
| WO | WO 2007/106124 | 9/2007 |

(Continued)

*Primary Examiner* — Allen Chan
(74) *Attorney, Agent, or Firm* — Neal, Gerber & Eisenberg LLP

(57) ABSTRACT

The gaming system and method disclosed herein provides that the probability that a group bonus event will be triggered for a plurality of gaming devices in the gaming system is independent of the number of players that are currently playing such gaming devices. The gaming system and method disclosed herein further provides that different players that are wagering different amounts at different rates are provided different quantities of evaluation points such that if a group bonus event is triggered, different players are provided different group bonus event awards proportional to each individual player's wagering activity.

6 Claims, 17 Drawing Sheets

(56) References Cited

U.S. PATENT DOCUMENTS

| | | | |
|---|---|---|---|
| 5,855,514 | A | 1/1999 | Kamille |
| 5,885,158 | A | 3/1999 | Torango et al. |
| 6,012,982 | A | 1/2000 | Piechowiak et al. |
| 6,077,162 | A | 6/2000 | Weiss |
| 6,089,980 | A | 7/2000 | Gauselmann |
| 6,159,097 | A | 12/2000 | Gura |
| 6,186,892 | B1 | 2/2001 | Frank et al. |
| 6,217,448 | B1 | 4/2001 | Olsen |
| 6,231,442 | B1 | 5/2001 | Mayeroff |
| 6,312,332 | B1 | 11/2001 | Walker et al. |
| 6,315,664 | B1 | 11/2001 | Baerlocher et al. |
| 6,390,473 | B1 | 5/2002 | Vancura et al. |
| 6,416,409 | B1 | 7/2002 | Jordan |
| 6,565,436 | B1 | 5/2003 | Baerlocher |
| 6,605,001 | B1 | 8/2003 | Tarantino |
| 6,656,048 | B2 | 12/2003 | Olsen |
| 6,726,563 | B1 | 4/2004 | Baerlocher et al. |
| 6,733,390 | B2 | 5/2004 | Walker et al. |
| 6,758,749 | B2 | 7/2004 | Krintzman |
| 6,780,110 | B2 | 8/2004 | Baerlocher et al. |
| 6,800,026 | B2 | 10/2004 | Cannon |
| 6,966,834 | B1 | 11/2005 | Johnson |
| 7,025,674 | B2 | 4/2006 | Adams et al. |
| 7,070,505 | B2 | 7/2006 | Vancura et al. |
| 7,074,127 | B2 | 7/2006 | Cuddy et al. |
| 7,081,050 | B2 | 7/2006 | Tarantino |
| 7,201,657 | B2 | 4/2007 | Baerlocher et al. |
| 7,291,067 | B2 | 11/2007 | Tarantino |
| 7,300,351 | B2 | 11/2007 | Thomas |
| 7,311,604 | B2 | 12/2007 | Kaminkow et al. |
| 7,393,280 | B2 | 7/2008 | Cannon |
| 7,427,236 | B2 | 9/2008 | Kaminkow et al. |
| 7,500,915 | B2 | 3/2009 | Wolf et al. |
| 7,513,827 | B2 | 4/2009 | Baerlocher |
| 2002/0058542 | A1 | 5/2002 | Roethel et al. |
| 2003/0003989 | A1 | 1/2003 | Johnson |
| 2003/0083943 | A1 | 5/2003 | Adams et al. |
| 2004/0116174 | A1 | 6/2004 | Baerlocher et al. |
| 2004/0176156 | A1 | 9/2004 | Walker et al. |
| 2005/0059468 | A1 | 3/2005 | Cannon |
| 2005/0218590 | A1 | 10/2005 | O'Halloran et al. |
| 2006/0025195 | A1 | 2/2006 | Pennington et al. |
| 2006/0030391 | A1 | 2/2006 | Casey et al. |
| 2006/0040732 | A1 | 2/2006 | Baerlocher et al. |
| 2006/0073897 | A1 | 4/2006 | Englman et al. |
| 2006/0079319 | A1 | 4/2006 | Aoki et al. |
| 2006/0111170 | A1 | 5/2006 | Hornik et al. |
| 2006/0189377 | A1 | 8/2006 | Gomez et al. |
| 2006/0287043 | A1 | 12/2006 | Englman et al. |
| 2007/0015585 | A1 | 1/2007 | Sartini et al. |
| 2007/0054732 | A1 | 3/2007 | Baerlocher |
| 2007/0054733 | A1 | 3/2007 | Baerlocher |
| 2007/0060297 | A1 | 3/2007 | Hein et al. |
| 2007/0077990 | A1 | 4/2007 | Cuddy et al. |
| 2007/0105619 | A1 | 5/2007 | Kniesteadt et al. |
| 2007/0105620 | A1 | 5/2007 | Cuddy et al. |
| 2007/0155485 | A1 | 7/2007 | Cuddy et al. |
| 2007/0167217 | A1 | 7/2007 | Kaminkow et al. |
| 2008/0026824 | A1 | 1/2008 | Muir |
| 2008/0032764 | A1 | 2/2008 | Cannon |
| 2008/0045341 | A1 | 2/2008 | Englman |
| 2008/0076527 | A1 | 3/2008 | Low et al. |
| 2008/0076531 | A1 | 3/2008 | Baerlocher et al. |
| 2008/0076532 | A1 | 3/2008 | Graham et al. |
| 2008/0076542 | A1 | 3/2008 | Iddings et al. |
| 2008/0102916 | A1 | 5/2008 | Kovacs et al. |
| 2008/0102920 | A1 | 5/2008 | Baerlocher |
| 2008/0108401 | A1 | 5/2008 | Baerlocher et al. |
| 2008/0108429 | A1 | 5/2008 | Davis et al. |
| 2008/0113765 | A1 | 5/2008 | DeWaal |
| 2008/0139274 | A1 | 6/2008 | Baerlocher |
| 2008/0139305 | A1 | 6/2008 | Vallejo et al. |
| 2008/0311980 | A1 | 12/2008 | Cannon |
| 2009/0011824 | A1 | 1/2009 | Englman et al. |
| 2009/0036202 | A1 | 2/2009 | Baerlocher et al. |
| 2009/0042644 | A1 | 2/2009 | Zielinski |
| 2009/0082091 | A1 | 3/2009 | Lutnick |
| 2009/0082092 | A1 | 3/2009 | Lutnick |
| 2009/0088253 | A1 | 4/2009 | Oberberger et al. |
| 2009/0093298 | A1 | 4/2009 | Michel |
| 2009/0111560 | A1 | 4/2009 | Davis et al. |
| 2009/0117970 | A1 | 5/2009 | DeWaal et al. |
| 2009/0117974 | A1 | 5/2009 | Hornik |
| 2009/0117979 | A1 | 5/2009 | Decasa, Jr. et al. |
| 2009/0117989 | A1 | 5/2009 | Arezina et al. |
| 2009/0124320 | A1 | 5/2009 | DeWaal |
| 2009/0124327 | A1 | 5/2009 | Caputo et al. |
| 2009/0124362 | A1 | 5/2009 | Cuddy et al. |
| 2009/0124363 | A1 | 5/2009 | Baerlocher et al. |
| 2009/0124366 | A1 | 5/2009 | Aoki et al. |
| 2009/0124385 | A1 | 5/2009 | Cuddy et al. |
| 2009/0143136 | A1 | 6/2009 | Thomas |
| 2009/0275411 | A1 | 11/2009 | Kisenwether et al. |

FOREIGN PATENT DOCUMENTS

| | | |
|---|---|---|
| WO | WO 2008/036661 | 3/2008 |
| WO | WO 2008/045398 | 4/2008 |
| WO | WO 2008/048634 | 4/2008 |
| WO | WO 2008/051796 | 5/2008 |

FIG. 8

| Wager Placed/ Evaluation | Accumulated Evaluation Points Before Determination to Trigger Group Bonus Event | Accumulated Evaluation Points Range | Assigned Group Bonus Event Multiplier | Increase in Accumulated Evaluation Points per Wager Placed | Reduction in Accumulated Evaluation Points for Determination to Trigger Group Bonus Event | Change in Accumulated Evaluation Points for Determination to Trigger Group Bonus Event | Accumulated Evaluation Points After Determination to Trigger Group Bonus Event |
|---|---|---|---|---|---|---|---|
| 1 | 0 | 0-249 | 1 | 100 | 60 | 40 | 40 |
| 2 | 40 | 0-249 | 1 | 100 | 60 | 40 | 80 |
| 3 | 80 | 0-249 | 1 | 100 | 60 | 40 | 120 |
| 4 | 120 | 0-249 | 1 | 100 | 60 | 40 | 160 |
| 5 | 160 | 0-249 | 1 | 100 | 60 | 40 | 200 |
| 6 | 200 | 0-249 | 1 | 100 | 60 | 40 | 240 |
| 7 | 240 | 0-249 | 1 | 100 | 60 | 40 | 280 |
| 8 | 280 | 250-499 | 2 | 100 | 120 | -20 | 260 |
| 9 | 260 | 250-499 | 2 | 100 | 120 | -20 | 240 |
| 10 | 240 | 0-249 | 1 | 100 | 60 | 40 | 280 |
| 11 | 280 | 250-499 | 2 | 100 | 120 | -20 | 260 |
| 12 | 260 | 250-499 | 2 | 100 | 120 | -20 | 240 |
| 13 | 240 | 0-249 | 1 | 100 | 60 | 40 | 280 |
| 14 | 280 | 250-499 | 2 | 100 | 120 | -20 | 260 |
| 15 | 260 | 250-499 | 2 | 100 | 120 | -20 | 240 |

FIG. 9A

| Wager Placed/ Evaluation | Accumulated Evaluation Points Before Determination to Trigger Group Bonus Event | Accumulated Evaluation Points Range | Assigned Group Bonus Event Multiplier | Increase in Accumulated Evaluation Points per Wager Placed | Reduction in Accumulated Evaluation Points for Determination to Trigger Group Bonus Event | Change in Accumulated Evaluation Points for Determination to Trigger Group Bonus Event | Accumulated Evaluation Points After Determination to Trigger Group Bonus Event |
|---|---|---|---|---|---|---|---|
| 1 | 0 | 0-249 | 1 | 200 | 15 | 185 | 185 |
| | 185 | 0-249 | 1 | 0 | 15 | -15 | 170 |
| | 170 | 0-249 | 1 | 0 | 15 | -15 | 155 |
| | 155 | 0-249 | 1 | 0 | 15 | -15 | 140 |
| 2 | 140 | 0-249 | 1 | 200 | 15 | 185 | 325 |
| | 325 | 250-499 | 2 | 0 | 30 | -30 | 295 |
| | 295 | 250-499 | 2 | 0 | 30 | -30 | 265 |
| | 265 | 250-499 | 2 | 0 | 30 | -30 | 235 |
| 3 | 235 | 0-249 | 1 | 200 | 15 | 185 | 420 |
| | 420 | 250-499 | 2 | 0 | 30 | -30 | 390 |
| | 390 | 250-499 | 2 | 0 | 30 | -30 | 360 |
| | 360 | 250-499 | 2 | 0 | 30 | -30 | 330 |
| 4 | 330 | 250-499 | 2 | 200 | 30 | 170 | 500 |
| | 500 | 500-749 | 3 | 0 | 45 | -45 | 455 |
| | 455 | 250-499 | 2 | 0 | 30 | -30 | 425 |
| | 425 | 250-499 | 2 | 0 | 30 | -30 | 395 |
| 5 | 395 | 250-499 | 2 | 200 | 30 | 170 | 565 |
| | 565 | 500-749 | 3 | 0 | 45 | -45 | 520 |

FIG. 9B

| | | | | | | | |
|---|---|---|---|---|---|---|---|
| | 520 | 500-749 | 3 | 0 | 45 | -45 | 475 |
| | 475 | 250-499 | 2 | 0 | 30 | -30 | 445 |
| 6 | 445 | 250-499 | 2 | 200 | 30 | 170 | 615 |
| | 615 | 500-749 | 3 | 0 | 45 | -45 | 570 |
| | 570 | 500-749 | 3 | 0 | 45 | -45 | 525 |
| | 525 | 500-749 | 3 | 0 | 45 | -45 | 480 |
| 7 | 480 | 250-499 | 2 | 200 | 30 | 170 | 650 |
| | 650 | 500-749 | 3 | 0 | 45 | -45 | 605 |
| | 605 | 500-749 | 3 | 0 | 45 | -45 | 560 |
| | 560 | 500-749 | 3 | 0 | 45 | -45 | 515 |
| 8 | 515 | 500-749 | 3 | 200 | 45 | 155 | 670 |
| | 670 | 500-749 | 3 | 0 | 45 | -45 | 625 |
| | 625 | 500-749 | 3 | 0 | 45 | -45 | 580 |
| | 580 | 500-749 | 3 | 0 | 45 | -45 | 535 |
| 9 | 535 | 500-749 | 3 | 200 | 45 | 155 | 690 |
| | 690 | 500-749 | 3 | 0 | 45 | -45 | 645 |
| | 645 | 500-749 | 3 | 0 | 45 | -45 | 600 |
| | 600 | 500-749 | 3 | 0 | 45 | -45 | 555 |
| 10 | 555 | 500-749 | 3 | 200 | 45 | 155 | 710 |
| | 710 | 500-749 | 3 | 0 | 45 | -45 | 665 |
| | 665 | 500-749 | 3 | 0 | 45 | -45 | 620 |
| | 620 | 500-749 | 3 | 0 | 45 | -45 | 575 |
| 11 | 575 | 500-749 | 3 | 200 | 45 | 155 | 730 |
| | 730 | 500-749 | 3 | 0 | 45 | -45 | 685 |

FIG. 9C

| | | | | | | | |
|---|---|---|---|---|---|---|---|
| | 685 | 500-749 | 3 | 0 | 45 | -45 | 640 |
| | 640 | 500-749 | 3 | 0 | 45 | -45 | 595 |
| 12 | 595 | 500-749 | 3 | 200 | 45 | 155 | 750 |
| | 750 | 750-999 | 4 | 0 | 60 | -60 | 690 |
| | 690 | 500-749 | 3 | 0 | 45 | -45 | 645 |
| | 645 | 500-749 | 3 | 0 | 45 | -45 | 600 |
| 13 | 600 | 500-749 | 3 | 200 | 45 | 155 | 755 |
| | 755 | 750-999 | 4 | 0 | 60 | -60 | 695 |
| | 695 | 500-749 | 3 | 0 | 45 | -45 | 650 |
| | 650 | 500-749 | 3 | 0 | 45 | -45 | 605 |
| 14 | 605 | 500-749 | 3 | 200 | 45 | 155 | 760 |
| | 760 | 750-999 | 4 | 0 | 60 | -60 | 700 |
| | 700 | 500-749 | 3 | 0 | 45 | -45 | 655 |
| | 655 | 500-749 | 3 | 0 | 45 | -45 | 610 |
| 15 | 610 | 500-749 | 3 | 200 | 45 | 155 | 765 |
| | 765 | 750-999 | 4 | 0 | 60 | -60 | 705 |
| | 705 | 500-749 | 3 | 0 | 45 | -45 | 660 |
| | 660 | 500-749 | 3 | 0 | 45 | -45 | 615 |
| 16 | 615 | 500-749 | 3 | 200 | 45 | 155 | 770 |
| | 770 | 750-999 | 4 | 0 | 60 | -60 | 710 |
| | 710 | 500-749 | 3 | 0 | 45 | -45 | 665 |
| | 665 | 500-749 | 3 | 0 | 45 | -45 | 620 |
| 17 | 620 | 500-749 | 3 | 200 | 45 | 155 | 775 |
| | 775 | 750-999 | 4 | 0 | 60 | -60 | 715 |

FIG. 9D

| | | | | | | | |
|---|---|---|---|---|---|---|---|
| | 715 | 500-749 | 3 | 0 | 45 | -45 | 670 |
| | 670 | 500-749 | 3 | 0 | 45 | -45 | 625 |
| 18 | 625 | 500-749 | 3 | 200 | 45 | 155 | 780 |
| | 780 | 750-999 | 4 | 0 | 60 | -60 | 720 |
| | 720 | 500-749 | 3 | 0 | 45 | -45 | 675 |
| | 675 | 500-749 | 3 | 0 | 45 | -45 | 630 |
| 19 | 630 | 500-749 | 3 | 200 | 45 | 155 | 785 |
| | 785 | 750-999 | 4 | 0 | 60 | -60 | 725 |
| | 725 | 500-749 | 3 | 0 | 45 | -45 | 680 |
| | 680 | 500-749 | 3 | 0 | 45 | -45 | 635 |
| 20 | 635 | 500-749 | 3 | 200 | 45 | 155 | 790 |
| | 790 | 750-999 | 4 | 0 | 60 | -60 | 730 |
| | 730 | 500-749 | 3 | 0 | 45 | -45 | 685 |
| | 685 | 500-749 | 3 | 0 | 45 | -45 | 640 |
| 21 | 640 | 500-749 | 3 | 200 | 45 | 155 | 795 |
| | 795 | 750-999 | 4 | 0 | 60 | -60 | 735 |
| | 735 | 500-749 | 3 | 0 | 45 | -45 | 690 |
| | 690 | 500-749 | 3 | 0 | 45 | -45 | 645 |
| 22 | 645 | 500-749 | 3 | 200 | 45 | 155 | 800 |
| | 800 | 750-999 | 4 | 0 | 60 | -60 | 740 |
| | 740 | 500-749 | 3 | 0 | 45 | -45 | 695 |
| | 695 | 500-749 | 3 | 0 | 45 | -45 | 650 |
| 23 | 650 | 500-749 | 3 | 200 | 45 | 155 | 805 |
| | 805 | 750-999 | 4 | 0 | 60 | -60 | 745 |
| | 745 | 500-749 | 3 | 0 | 45 | -45 | 700 |
| | 700 | 500-749 | 3 | 0 | 45 | -45 | 655 |

FIG. 9E

| | | | | | | | |
|---|---|---|---|---|---|---|---|
| 24 | 655 | 500-749 | 3 | 200 | 45 | 155 | 810 |
| | 810 | 750-999 | 4 | 0 | 60 | -60 | 750 |
| | 750 | 750-999 | 4 | 0 | 60 | -60 | 690 |
| | 690 | 500-749 | 3 | 0 | 45 | -45 | 645 |
| 25 | 645 | 500-749 | 3 | 200 | 45 | 155 | 800 |
| | 800 | 750-999 | 4 | 0 | 60 | -60 | 740 |
| | 740 | 500-749 | 3 | 0 | 45 | -45 | 695 |
| | 695 | 500-749 | 3 | 0 | 45 | -45 | 650 |
| 26 | 650 | 500-749 | 3 | 200 | 45 | 155 | 805 |
| | 805 | 750-999 | 4 | 0 | 60 | -60 | 745 |
| | 745 | 500-749 | 3 | 0 | 45 | -45 | 700 |
| | 700 | 500-749 | 3 | 0 | 45 | -45 | 655 |
| 27 | 655 | 500-749 | 3 | 200 | 45 | 155 | 810 |
| | 810 | 750-999 | 4 | 0 | 60 | -60 | 750 |
| | 750 | 750-999 | 4 | 0 | 60 | -60 | 690 |
| | 690 | 500-749 | 3 | 0 | 45 | -45 | 645 |
| 28 | 645 | 500-749 | 3 | 200 | 45 | 155 | 800 |
| | 800 | 750-999 | 4 | 0 | 60 | -60 | 740 |
| | 740 | 500-749 | 3 | 0 | 45 | -45 | 695 |
| | 695 | 500-749 | 3 | 0 | 45 | -45 | 650 |
| 29 | 650 | 500-749 | 3 | 200 | 45 | 155 | 805 |
| | 805 | 750-999 | 4 | 0 | 60 | -60 | 745 |
| | 745 | 500-749 | 3 | 0 | 45 | -45 | 700 |
| | 700 | 500-749 | 3 | 0 | 45 | -45 | 655 |
| 30 | 655 | 500-749 | 3 | 200 | 45 | 155 | 810 |
| | 810 | 750-999 | 4 | 0 | 60 | -60 | 750 |
| | 750 | 750-999 | 4 | 0 | 60 | -60 | 690 |
| | 690 | 500-749 | 3 | 0 | 45 | -45 | 645 |

FIG. 10A

| Evaluation | Accumulated Evaluation Points Before Determination to Trigger Group Bonus Event | Accumulated Evaluation Points Range | Assigned Group Bonus Event Multiplier | Reduction in Accumulated Evaluation Points for Determination to Trigger Group Bonus Event | Accumulated Evaluation Points After Determination to Trigger Group Bonus Event |
|---|---|---|---|---|---|
| 1 | 2650 | 2600-2999 | 25 | 300 | 2350 |
| 2 | 2350 | 2200-2599 | 15 | 180 | 2170 |
| 3 | 2170 | 1800-2199 | 10 | 120 | 2050 |
| 4 | 2050 | 1800-2199 | 10 | 120 | 1930 |
| 5 | 1930 | 1800-2199 | 10 | 120 | 1810 |
| 6 | 1810 | 1800-2199 | 10 | 120 | 1690 |
| 7 | 1690 | 1400-1799 | 7 | 84 | 1606 |
| 8 | 1606 | 1400-1799 | 7 | 84 | 1522 |
| 9 | 1522 | 1400-1799 | 7 | 84 | 1438 |
| 10 | 1438 | 1400-1799 | 7 | 84 | 1354 |
| 11 | 1354 | 1000-1399 | 5 | 60 | 1294 |
| 12 | 1294 | 1000-1399 | 5 | 60 | 1234 |
| 13 | 1234 | 1000-1399 | 5 | 60 | 1174 |
| 14 | 1174 | 1000-1399 | 5 | 60 | 1114 |
| 15 | 1114 | 1000-1399 | 5 | 60 | 1054 |
| 16 | 1054 | 1000-1399 | 5 | 60 | 994 |
| 17 | 994 | 750-999 | 4 | 48 | 946 |
| 18 | 946 | 750-999 | 4 | 48 | 898 |
| 19 | 898 | 750-999 | 4 | 48 | 850 |
| 20 | 850 | 750-999 | 4 | 48 | 802 |
| 21 | 802 | 750-999 | 4 | 48 | 754 |
| 22 | 754 | 750-999 | 4 | 48 | 706 |
| 23 | 706 | 500-749 | 3 | 36 | 670 |
| 24 | 670 | 500-749 | 3 | 36 | 634 |
| 25 | 634 | 500-749 | 3 | 36 | 598 |
| 26 | 598 | 500-749 | 3 | 36 | 562 |
| 27 | 562 | 500-749 | 3 | 36 | 526 |
| 28 | 526 | 500-749 | 3 | 36 | 490 |
| 29 | 490 | 250-499 | 2 | 24 | 466 |
| 30 | 466 | 250-499 | 2 | 24 | 442 |
| 31 | 442 | 250-499 | 2 | 24 | 418 |
| 32 | 418 | 250-499 | 2 | 24 | 394 |

FIG. 10B

| | | | | | |
|---|---|---|---|---|---|
| 33 | 394 | 250-499 | 2 | 24 | 370 |
| 34 | 370 | 250-499 | 2 | 24 | 346 |
| 35 | 346 | 250-499 | 2 | 24 | 322 |
| 36 | 322 | 250-499 | 2 | 24 | 298 |
| 37 | 298 | 250-499 | 2 | 24 | 274 |
| 38 | 274 | 250-499 | 2 | 24 | 250 |
| 39 | 250 | 250-499 | 2 | 24 | 226 |
| 40 | 226 | 0-249 | 1 | 12 | 214 |
| 41 | 214 | 0-249 | 1 | 12 | 202 |
| 42 | 202 | 0-249 | 1 | 12 | 190 |
| 43 | 190 | 0-249 | 1 | 12 | 178 |
| 44 | 178 | 0-249 | 1 | 12 | 166 |
| 45 | 166 | 0-249 | 1 | 12 | 154 |
| 46 | 154 | 0-249 | 1 | 12 | 142 |
| 47 | 142 | 0-249 | 1 | 12 | 130 |
| 48 | 130 | 0-249 | 1 | 12 | 118 |
| 49 | 118 | 0-249 | 1 | 12 | 106 |
| 50 | 106 | 0-249 | 1 | 12 | 94 |
| 51 | 94 | 0-249 | 1 | 12 | 82 |
| 52 | 82 | 0-249 | 1 | 12 | 70 |
| 53 | 70 | 0-249 | 1 | 12 | 58 |
| 54 | 58 | 0-249 | 1 | 12 | 46 |
| 55 | 46 | 0-249 | 1 | 12 | 34 |
| 56 | 34 | 0-249 | 1 | 12 | 22 |
| 57 | 22 | 0-249 | 1 | 12 | 10 |
| 58 | 10 | 0-249 | - | not enough | - |

GAMING SYSTEM AND METHOD PROVIDING ADJUSTABLE ODDS FOR TRIGGERING A GROUP BONUS EVENT

PRIORITY CLAIM

This application is a divisional of, claims priority to and the benefit of U.S. patent application Ser. No. 14/676,505, filed on Apr. 1, 2015, which is a continuation of, claims priority to and the benefit of U.S. patent application Ser. No. 12/473,493, filed on May 28, 2009, which claims priority to and the benefit of U.S. Provisional Patent Application Ser. No. 61/061,328, filed Jun. 13, 2008, the entire contents of which are each incorporated by reference herein.

COPYRIGHT NOTICE

A portion of the disclosure of this patent document contains or may contain material which is subject to copyright protection. The copyright owner has no objection to the photocopy reproduction by anyone of the patent document or the patent disclosure in exactly the form it appears in the Patent and Trademark Office patent file or records, but otherwise reserves all copyright rights whatsoever.

BACKGROUND

Gaming machines which provide players awards in primary or base games are well known. Gaming machines generally require the player to place or make a wager to activate the primary or base game. In many of these gaming machines, the award is based on the player obtaining a winning symbol or symbol combination and based on the amount of the wager (e.g., the higher the wager, the higher the award). Symbols or symbol combinations which are less likely to occur usually provide higher awards.

In such known gaming machines, the amount of the wager made on the base game by the player may vary. For instance, the gaming machine may allow the player to wager a minimum number of credits, such as one credit (e.g., one cent, nickel, dime, quarter or dollar) up to a maximum number of credits, such as five credits. This wager may be made by the player a single time or multiple times in a single play of a primary game. For instance, a slot game may have one or more paylines and the slot game may allow the player to make a wager on each payline in a single play of the primary game. Slot games with 1, 3, 5, 9, 15 and 25 lines are widely commercially available. Thus, it is known that a gaming machine, such as a slot game, may allow players to make wagers of substantially different amounts on each play of the primary or base game ranging, for example, from one credit up to 125 credits (e.g., five credits on each of 25 separate paylines). This is also true for other wagering games, such as video draw poker, where players can wager one or more credits on each hand and where multiple hands can be played simultaneously.

Secondary or bonus games are also known in gaming machines. The secondary or bonus games usually provide an additional award to the player. Secondary or bonus games usually do not require an additional wager by the player to be activated. Secondary or bonus games are generally activated or triggered upon an occurrence of a designated triggering symbol or triggering symbol combination in the primary or base game. For instance, a bonus symbol occurring on the payline on the third reel of a three reel slot machine may trigger the secondary bonus game. When a secondary or bonus game is triggered, the gaming machines generally indicates this to the player through one or more visual and/or audio output devices, such as the reels, lights, speakers, video screens, etc. Part of the enjoyment and excitement of playing certain gaming machines is the occurrence of the secondary or bonus game (even before the player knows how much the bonus award will be).

Certain known gaming systems are configured to provide awards to multiple gaming machines or groups of gaming machines. These awards are sometimes displayed by a single display for multiple gaming machines. For instance, progressive awards associated with gaming machines are known. In one form, a known progressive award includes an initial amount funded by a casino and an additional amount funded through a portion of each wager made on the progressive gaming machine. For example, 1% of each wager placed on the primary game of the gaming machine may be allocated to the progressive award or progressive award fund. The progressive award grows in value as more players play the gaming machine and more portions of the players' wagers are allocated to the progressive award. When a player obtains a winning symbol or symbol combination which results in the progressive award, the accumulated progressive award is provided to the player. After the progressive award is provided to the player, the amount of the next progressive award is reset to the initial value and a portion of each subsequent wager is allocated to that next progressive award as described above.

In recent years, gaming has become a more social leisure activity. Gaming establishments often strive for ways to enable players to work together in gaming. Working together creates camaraderie among the players and provides an enhanced gaming experience. In certain known group games, to account for the number of complicated issues in providing a group game to a plurality of players at a plurality of gaming devices, a mystery trigger is utilized to determine when a group game is triggered. While such mystery triggers often leave players not knowing why they were included or excluded from the triggered group game, these mystery triggers avoid certain disadvantages in triggering a group game based on a symbol-driven event (i.e., a generation of one or more designated symbols in a player's base game). One disadvantage of utilizing a symbol-driven event to trigger a group game is that if less players are playing the gaming machines, then less total games will be played on the gaming machines in the gaming system and it will take longer for a triggering of the group game to occur. Longer periods of time between group games may discourage players and lead to player fatigue. Such player fatigue can lead to players walking away from the gaming machines because they no longer find it worth the cost of continuing to play. Additionally, utilizing a symbol-driven event to trigger a group game causes gaming system designers to incur certain mathematical complications, such as accounting for a group game that has different quantities of players playing at different times, in determining the payouts for the group games. Accordingly, certain known group games limit the "group effort" feeling that players experience in such group games because at best, the group shares in a bonus event while the effect that each player has on the group is minimum to none.

There is a continuing need to provide secondary games which include a group gaming aspect, wherein a plurality of players playing at linked gaming machines participate in a group event for one or more awards. There is also a continuing need to provide new and different gaming machines and gaming systems as well as new and different ways to provide awards to players including bonus awards.

Additionally, there is a continuing need to provide new and different linked or related gaming machines.

SUMMARY

In one embodiment, the gaming system and method disclosed herein provides a constant or substantially constant total gaming system probability of triggering a group bonus event for the players of the active gaming devices in the gaming system regardless of the number of players playing the gaming devices in the gaming system. In one such embodiment, based on the quantity of players playing the gaming devices in the gaming system, the gaming system modifies each gaming device's individual probability of triggering the group bonus event. In this embodiment, the gaming system modifies each gaming device's individual probability of triggering the group bonus event based on a target total gaming system probability of triggering the group bonus event. Accordingly, the gaming system and method disclosed herein provides that the target total or target overall gaming system probability that a group bonus event will be triggered for the gaming devices which form a group of gaming devices is independent of the number of players that, at any point in time, are currently playing such gaming devices.

In one embodiment, the gaming system disclosed herein includes a central server, central controller or remote host in communication with or linked to a plurality of gaming machines or gaming devices. In one embodiment, at a given point in time, each gaming device's individual probability of triggering the group bonus event (for each evaluation or determination of whether to trigger the group bonus event) is inversely proportional to the total number of players actively playing the gaming devices in the gaming system at that point in time. In this embodiment, since a triggering of the group bonus event for any of the players of the gaming devices in the gaming system causes a triggering of the group bonus event which will apply to each of the players of the actively played gaming devices in the gaming system, the central server adjusts or modifies each gaming device's individual probability of triggering the group bonus event (for each evaluation or determination of whether to trigger the group bonus event) to account for different numbers of players actively playing the gaming devices in the gaming system. That is, the lower the number of players currently playing the gaming devices in the gaming system at a given point in time, the greater each gaming device's individual probability of causing a triggering of a group bonus event which will apply to each of the players of each of the actively played gaming devices.

For example, if a first number of players (e.g., four players) are currently actively playing the gaming devices in the gaming system at a first point in time (or a first number of players, each of the gaming devices of the first number of players will have a first probability or chance of triggering the group bonus event (e.g., a $1/400$ chance of triggering the group bonus event.) The sum of each of these gaming device individual probabilities of triggering the group bonus event form a first gaming system total probability or chance (e.g., a $4/400$ or $1/100$) of triggering the group bonus event for the first number of players. In this example, if a second, lower number of players (e.g., two players) are currently actively playing the gaming devices in the gaming system at a second, different point in time, each of the gaming devices of the second number of players will have a second, greater probability or chance of triggering the group bonus event (e.g., a $1/200$ chance of triggering the group bonus event for any evaluation for that gaming device at the second point in time of whether to trigger the group bonus event) such that the gaming system will still have the first total probability or chance (e.g., a $2/200$ or $1/100$) of triggering the group bonus event for the second number of players. Accordingly, the gaming system disclosed herein provides that regardless of if a single gaming device in the gaming system is currently being actively played or if each of the gaming devices in the gaming system are currently being actively played, the gaming system adjusts each individual gaming device's individual probability of triggering the group bonus event such that the target total gaming system probability of triggering a group bonus event is reached (or substantially reached) and the gaming system's total probability of triggering the group bonus event remains the same (or substantially the same).

It should be appreciated that in one embodiment, the gaming system target total probability of triggering a group bonus event represents the probability that a group bonus event will be triggered within a total quantity of games played (or a total quantity of determinations of whether or not to trigger the group bonus event), wherein the total quantity of games played (or the total quantity of determinations of whether or not to trigger the group bonus event) is equal to the quantity of players actively playing the gaming devices in the gaming system. For example, if three players are currently actively playing three gaming devices in the gaming system at a first point in time, the probability that a group bonus event will be triggered within three games played (i.e., within three determinations of whether or not to trigger the group bonus event) is equal to the probability of a group bonus event being triggered within four games played (i.e., within four determinations of whether or not to trigger the group bonus event) if four players are currently actively playing four gaming devices in the gaming system at a second point in time. In one embodiment, the target total gaming system probability of triggering the group bonus event is a constant or substantially constant probability that a number of games played or a number of group bonus event triggering determinations made (which is equal to the number of players currently actively playing the gaming devices in the gaming system) will yield a group bonus event triggering outcome. In one such embodiment, the gaming system adjusts each individual gaming device's probability of triggering the group bonus event to provide that the total gaming system probability per game play round (i.e., a quantity of games played equal to the number of players currently actively playing the gaming devices in the gaming system) remains the same or substantially the same regardless of the number of players actively playing the gaming devices.

In one embodiment, the gaming system utilizes a symbol-driven event (i.e., the generation of one or more symbols in a primary or base game) to cause a triggering of a group bonus event. In one embodiment, the gaming system employs one or more group bonus event triggering symbols, such as sub-symbols, secondary symbols or overlay symbols, to adjust or modify each gaming device's individual probability of triggering the group bonus event (based on the quantity of players actively playing the gaming devices in the gaming system). In one such embodiment, a generation of one or more group bonus event triggering symbols causes a triggering of the group bonus event which will apply to each of the actively played gaming devices. In this embodiment, the central server modifies the frequency of generating such group bonus event triggering symbols (based on the quantity of players actively playing the gaming devices in the gaming system) to modify each gaming device's individual probability of triggering the group bonus event.

In an example of this embodiment, if only a first player is playing a first gaming device in the gaming system at a first point in time, the central server provides that the first gaming device would, on average, generate a designated combination of group bonus event triggering symbols once every one-hundred plays of the primary game. In this example, if a second player begins playing a second gaming device in the gaming system at a second point in time, the central server provides that the first gaming device and the second gaming device will each, on average, generate the designated combination of group bonus event triggering symbols once every two-hundred plays of the primary game. It should be appreciated that in this example, since the generation of the designated combination of group bonus event triggering symbols for either the first player or the second player causes a triggering of the group bonus event for both the first player and the second player, the lowered individual odds of generating the designated combination of group bonus event triggering symbols is accounted for by the increased total number of plays of the primary game. Thus, in this example, the target total gaming system probability of triggering the group bonus event is reached: (i) for when only the first player is playing a gaming device in the gaming system (i.e., 1/100) and also (ii) for when both the first player and the second player are each playing gaming devices in the gaming system (i.e., 2/200 or 1/100).

In one embodiment, the gaming system utilizes a group bonus event participation sequence or group sub-bonus event to determine whether or not the gaming devices in the gaming system will enter or otherwise participate in the group bonus event. In this embodiment, if the player participating in the group bonus event participation sequence is successful in the group bonus event participation sequence, the central server triggers the group bonus event and each of the players currently actively playing the gaming devices in the gaming system participate in the group bonus event. On the other hand, if the player participating in the group bonus event participation sequence is unsuccessful in the group bonus event participation sequence, the central server does not trigger the group bonus event and none of the players at any of the gaming devices in the gaming system participate in the group bonus event.

In one such embodiment, any gaming device in the gaming system can trigger the group bonus event participation sequence based on one or more events associated with such gaming device's primary games played. In this embodiment, the probability of triggering the group bonus event participating sequence is independent of the quantity of players currently playing the gaming devices in the gaming system. In this embodiment, once the group bonus event participation sequence is triggered, the probability of generating a successful outcome in the group bonus event participation sequence (and thus triggering the group bonus event) is dependent or otherwise based on the quantity of players currently actively playing the gaming devices in the gaming system. In such an embodiment, as any gaming device in the gaming system can trigger the group bonus event participation sequence, the greater the quantity of players at the gaming devices in the gaming system, the greater the frequency that the group bonus event participation sequence is triggered. Accordingly, to maintain that the target total gaming system probability of triggering the group bonus event is reached (and remains constant) regardless of the number of players currently playing the gaming devices in the gaming system, the central server adjusts or modifies the probability of the group bonus event participation sequence causing a triggering of the group bonus event depending on the number of players currently playing the gaming devices in the gaming system.

In an example of this embodiment, if one of the gaming devices triggers the group bonus event participation sequence, on average, once every twenty plays of the primary game (regardless of the number of players currently actively playing the gaming devices), only a first player is playing a first gaming device in the gaming system at a first point in time and the central server triggers the group bonus event participation sequence for the first player, the central server provides that the first gaming device would have a one-in-five chance of success in the group bonus event participation sequence. In this example, if a second player begins playing a second gaming device in the gaming system at a second point in time and the central server triggers the group bonus event participation sequence for either the first player or the second player, the central server provides that the triggering gaming device would have a one-in-ten chance of success in the group bonus event participation sequence. It should be appreciated that in this example, since a successful outcome in the group bonus event participation sequence causes a triggering of the group bonus event for both the first player and the second player, the modification of the odds of success in the group bonus event participation sequence maintains that the target total gaming system probability of triggering the group bonus event is approached or reached regardless of the quantity of players actively playing the gaming devices in the gaming system. That is, in this example, if only the first player is actively playing a gaming device in the gaming system, the gaming system's total probability of triggering the group bonus event is 1/100 (i.e., (1/20 plays of the primary game triggers the group bonus event participation sequence)×(1/5 chance of success in the group bonus event participation sequence)) and if the first and second players are both actively playing gaming devices in the gaming system, the gaming system's total probability of triggering the group bonus event is 2/200 or 1/100 (i.e., (2/20 plays of the primary game triggers the group bonus event participation sequence)×(1/10 chance of success in the group bonus event participation sequence)).

In one embodiment, the gaming system and method disclosed herein further employs a point-based or ranking-based system to: (i) determine each individual player's eligibility to participate in a triggered group bonus event; and (ii) to scale each individual player's group bonus event award based on one or more factors specific for that individual player. In one such embodiment, a player's eligibility to participate in a triggered group bonus event is based on that player currently having at least one accumulated eligibility point when the group bonus event is triggered. Thus, in this embodiment, one or more accumulated eligibility points represents a chance for a player to participate in a triggered group bonus event. Additionally, in this embodiment, the point-based system accounts for each individual player's coin-in or wagered amount to provide that each individual player's group bonus event award (for a triggered group bonus event) correlates to that individual player's coin-in or wagered amount. In this embodiment, accumulating eligibility points facilities a player's participation in the group bonus event and also determines a group bonus event multiplier to apply to the player's group bonus event award. Accordingly, the gaming system and method disclosed herein is configured such that different players that are wagering different amounts at different rates are provided different quantities of points and ultimately different group bonus event awards proportional to each individual player's wagering activity for a period of time.

In one embodiment, for each designated wager (i.e., a primary game wager or a side wager) placed by a player at a gaming device in the gaming system, the central server provides the player a designated quantity of evaluation points. In this embodiment, for each determination (of whether the group bonus event will be triggered) associated with any actively played gaming device in the gaming system, the central server also reduces each player's quantity of accumulated evaluation points. As described above, a triggering of the group bonus event at any of the gaming devices in the gaming system causes a triggering of the group bonus event for each of the players at each of the gaming devices with at least a designated quantity of accumulated evaluations points. Thus, as each determination of whether to trigger the group bonus event represents a chance for each player to participate in the group bonus event, such determinations result in a reduction of each player's quantity of provided evaluation points. That is, each determination of whether to trigger the group bonus event has the potential to trigger the group bonus event for each of the players at each of the actively played gaming devices and thus each determination subtracts a quantity of evaluation points from each player in the group.

An example of this embodiment is a first player at a first gaming device in the gaming system has accumulated one-thousand evaluation points, and a second player at a second gaming device in the gaming system has accumulated one-hundred evaluation points. In this example, if the first player wagers one credit on each available payline and a fifty credit side wager (to earn evaluation points and cause a determination of whether or not to trigger a group bonus event), the first player earns one-hundred evaluation points (i.e., for placing the designated wager) and loses sixty evaluation points (for the potential benefit of participating in any triggered group bonus event) for a net of forty evaluation points accumulated. In this example, the second player also loses sixty evaluation points (for the potential benefit of participating in any triggered group bonus event). Accordingly, in one embodiment, for each designated wager placed by a specific player, that specific player earns one or more eligibility points. Moreover, for each designated wager placed by a player, the gaming system determines whether or not to trigger the group bonus event, wherein such determination causes each of the players actively playing a gaming device in the gaming system to simultaneously forfeit one or more eligibility points. It should be appreciated that reducing each player's quantity of accumulated evaluation points for each determination of whether or not to trigger the group bonus event provides that a first player who gains eligibility for a group bonus event and then waits for other players to continue playing (in hopes that these other players trigger the group bonus event for the first player) would lose eligibility to participate in the group bonus event as they run out of evaluation points.

In one embodiment, for each gaming device, the gaming system adjusts the quantity of evaluation points decremented for each determination of whether or not to trigger the group bonus event to account for the adjustments in that gaming device's individual probability of triggering a group bonus event (which are based on the quantity of players actively playing the gaming devices in the gaming system). In this embodiment, as the central server adjusts each gaming device's individual probability of triggering the group bonus event for each evaluation of whether to trigger the group bonus event (as described above), the central server also adjusts the quantity of evaluation points used (per determination of whether or not to trigger the group bonus event) to compensate for such adjusted individual probabilities. For example, if only a first player is playing a first gaming device in the gaming system at a first point in time, the central server determines that the first gaming device would, on average, trigger the group bonus event once every one-hundred plays of the primary game and each determination of whether or not to trigger the group bonus event (i.e., each play of the primary game) reduces the first player's quantity of accumulated evaluation points by fifty evaluation points. In this example, if a second player begins playing a second gaming device in the gaming system at a second point in time (and the second player plays at substantially the same rate as the first player), the central server determines that the first gaming device and the second gaming device will each, on average, trigger the group bonus event once every two-hundred plays of the primary game (as described above) and each determination of whether or not to trigger the group bonus event (i.e., each play of the primary game) reduces both players' quantity of accumulated evaluation points by twenty-five evaluation points. In this example, as it will take each player, on average, twice as many plays of the primary game to trigger the group bonus event which will apply to each of the gaming devices in the gaming system, the reduction in evaluation points per primary game played is reduced in half to compensate for the increased number of plays of the primary game.

In one embodiment, the gaming system also utilizes each player's accumulated eligibility points to determine a group bonus event multiplier to assign to that player. In one such embodiment, to reward players for earning greater quantities of evaluation points by wagering greater amounts and for wagering more quickly (compared to other players at other gaming devices in the gaming system), the central server assigns a group bonus event multiplier to a player based on that player's quantity of accumulated evaluation points. In one embodiment, different levels or ranges of accumulated evaluation points are associated with different group bonus event multipliers to be assigned to the player. It should be appreciated that in this embodiment, as the player's quantity of evaluation points frequently changes due to the player earning evaluation points for designated wagers placed and forfeiting evaluation points for group bonus event triggering determinations, the group bonus event multiplier assigned to that player frequently changes as well.

In one embodiment, the player's assigned group bonus event multiplier is applied to the quantity of evaluation points decremented from each player for every determination of whether or not to trigger the group bonus event (but is not applied to the quantity of evaluation points provided per designated wager placed). In this embodiment, the greater the group bonus event multiplier assigned to a player at a given point in time, the greater the quantity of evaluation points decremented from the player for a determination (of whether or not to trigger the group bonus event) which occurs at that point in time. Such a configuration provides a cap to the number of evaluation points a player may accumulate as well as to the amount of any group bonus event multiplier assigned to a player. That is, if a player is betting rapidly and builds up their evaluation points enough, the central server assigns the player a greater group bonus event multiplier. However, as this group bonus event multiplier also multiplies the number of points decremented for each determination of whether or not to trigger the group bonus event, it is possible for the group bonus event multiplier to get high enough that the multiplied decrement of evaluation points is more than the maximum number of possible evaluation points earned by each designated wager placed (thus resulting in a net loss of evaluation points). Accordingly, the quantity of evaluation points a player may accumulate is capped and therefore the group bonus event multiplier assigned to the player is capped as well.

In one embodiment, the gaming system further utilizes any group bonus event multiplier assigned to a player to modify the amount of any group bonus event award provided to that player. In one embodiment, the player's currently assigned group bonus event multiplier is applied to any group bonus event award for a triggered group bonus event to provide the player a greater award for participating in the group bonus event. In this embodiment, as the quantity of accumulated evaluation points and thus the currently assigned group bonus event multiplier are based, at least in part, on each individual player's coin-in amount, the gaming system disclosed herein provides that different players with different coin-in amounts are provided different group bonus event awards proportional to each individual player's coin-in amount for a period of time.

Accordingly, the gaming system and method disclosed herein provides that the probability that a group bonus event will be triggered for a plurality of gaming devices in the gaming system is independent of the number of players that are currently playing such gaming devices. The gaming system and method disclosed herein further provides that different players that are wagering different amounts at different rates are provided different quantities of evaluation points such that if a group bonus event is triggered, different players are provided different group bonus event awards proportional to each individual player's wagering activity.

Additional features and advantages are described herein, and will be apparent from the following Detailed Description and the figures.

BRIEF DESCRIPTION OF THE FIGURES

FIG. 8 is a table illustrating an accumulation of a quantity of evaluation points and the affect a player's assigned group bonus event multiplier has on such accumulation.

FIGS. 9A, 9B, 9C, 9D and 9E are a table illustrating an accumulation of a quantity of evaluation points and the affect other player's gaming activities has on such accumulation.

FIGS. 10A and 10B are a table illustrating the deduction in the quantity of a player's evaluation points due to inactivity.

DETAILED DESCRIPTION

The present disclosure may be implemented in various configurations for gaming machines, gaming devices, or gaming systems, including but not limited to: (1) a dedicated gaming machine, gaming device, or gaming system wherein the computerized instructions for controlling any games (which are provided by the gaming machine or gaming device) are provided with the gaming machine or gaming device prior to delivery to a gaming establishment; and (2) a changeable gaming machine, gaming device, or gaming system wherein the computerized instructions for controlling any games (which are provided by the gaming machine or gaming device) are downloadable to the gaming machine or gaming device through a data network after the gaming machine or gaming device is in a gaming establishment. In one embodiment, the computerized instructions for controlling any games are executed by at least one central server, central controller, or remote host. In such a "thin client" embodiment, the central server remotely controls any games (or other suitable interfaces) and the gaming device is utilized to display such games (or suitable interfaces) and receive one or more inputs or commands from a player. In another embodiment, the computerized instructions for controlling any games are communicated from the central server, central controller, or remote host to a gaming device local processor and memory devices. In such a "thick client" embodiment, the gaming device local processor executes the communicated computerized instructions to control any games (or other suitable interfaces) provided to a player.

In one embodiment, one or more gaming devices in a gaming system may be thin client gaming devices and one or more gaming devices in the gaming system may be thick client gaming devices. In another embodiment, certain functions of the gaming device are implemented in a thin client environment and certain other functions of the gaming device are implemented in a thick client environment. In one such embodiment, computerized instructions for controlling any primary games are communicated from the central server to the gaming device in a thick client configuration and computerized instructions for controlling any secondary games or bonus functions are executed by a central server in a thin client configuration.

Figure 1A:
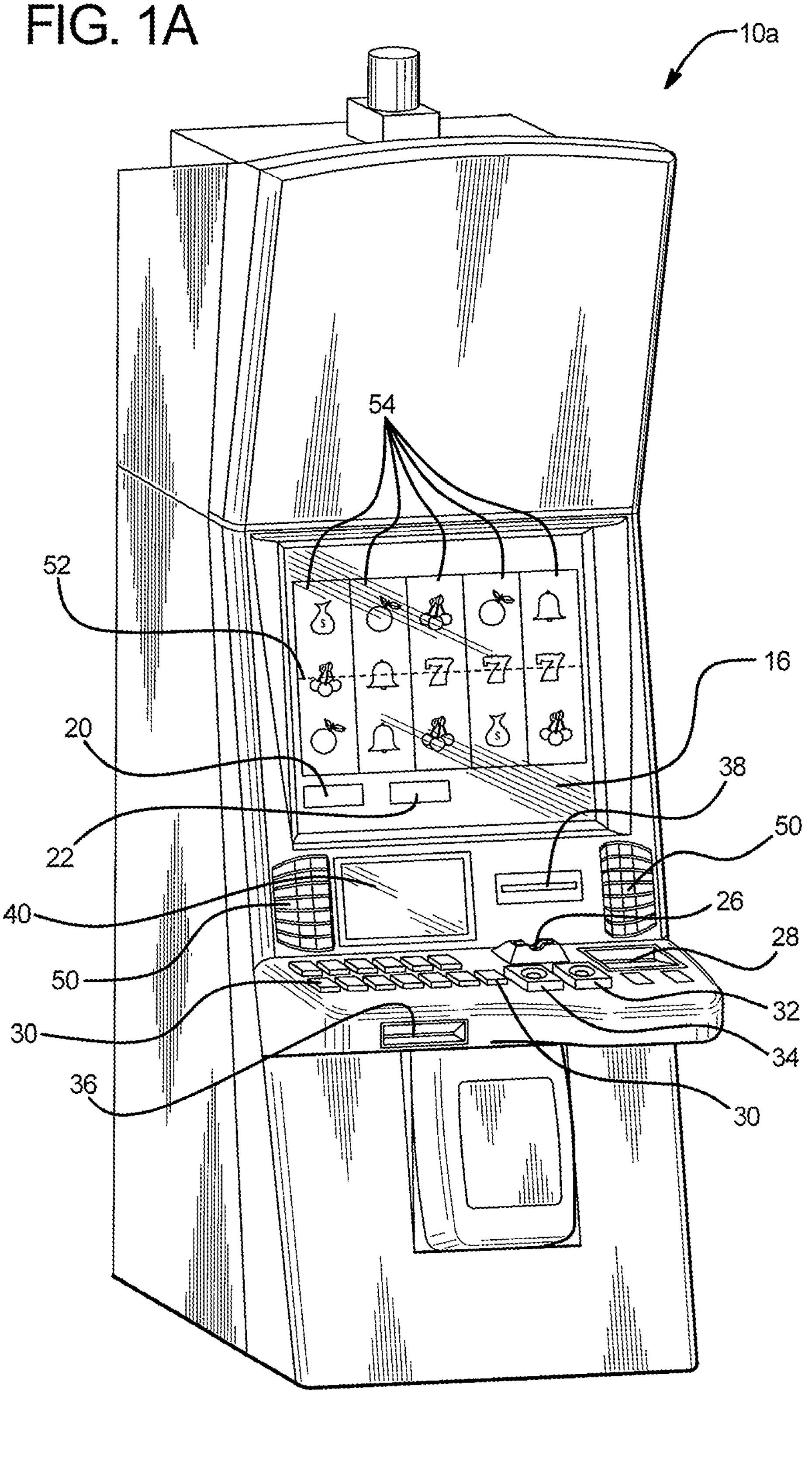
FIGS. 1A and 1B are perspective views of example alternative embodiments of the gaming device of the present disclosure.
Figure 1B:
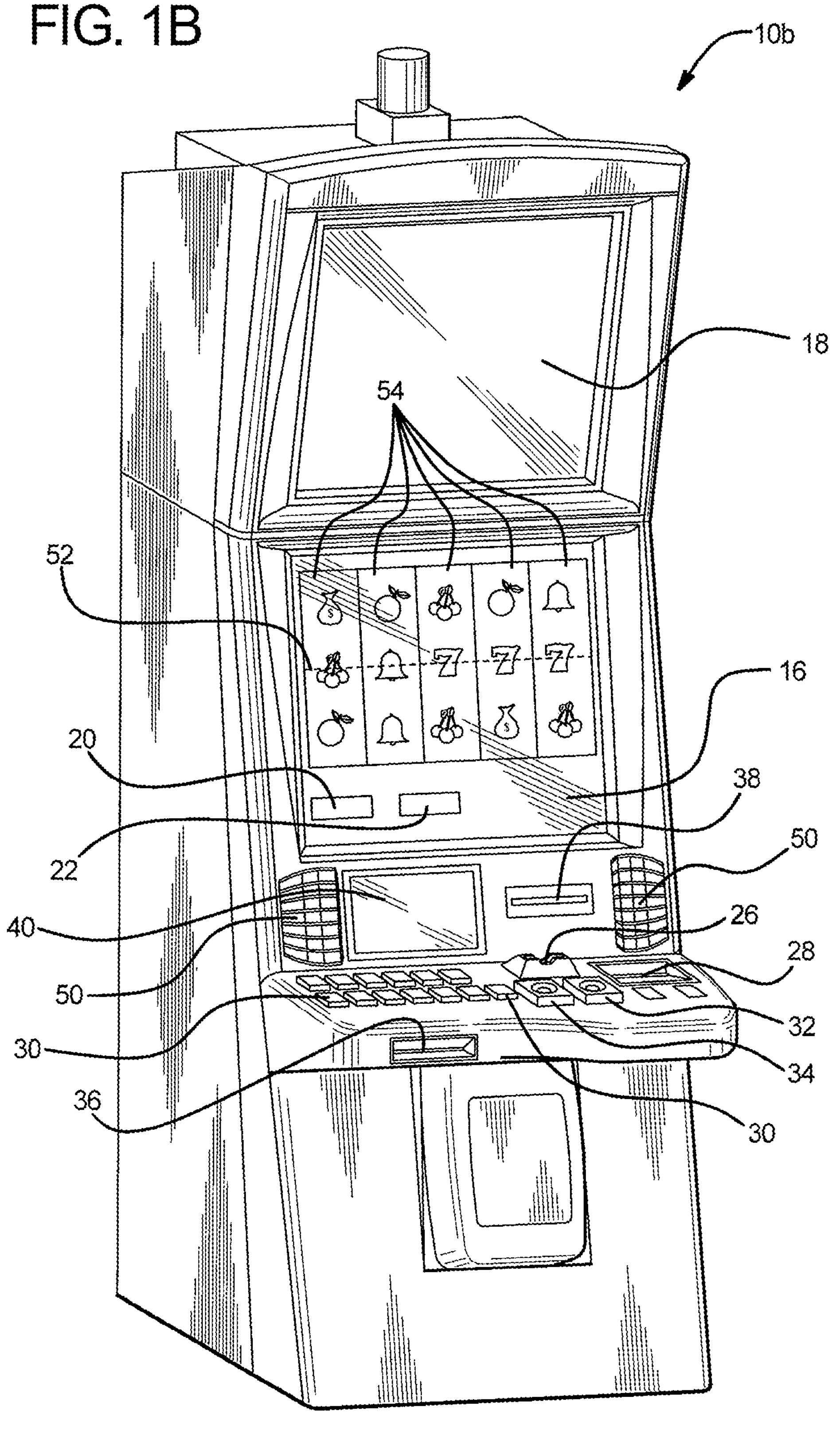

Referring now to the drawings, two example alternative embodiments of a gaming device disclosed herein are illustrated in FIGS. 1A and 1B as gaming device 10*a* and gaming device 10*b*, respectively. Gaming device 10*a* and/or gaming device 10*b* are generally referred to herein as gaming device 10.

In the embodiments illustrated in FIGS. 1A and 1B, gaming device 10 has a support structure, housing, or cabinet which provides support for a plurality of displays, inputs, controls, and other features of a conventional gaming machine. It is configured so that a player can operate it while standing or sitting. The gaming device can be positioned on a base or stand or can be configured as a pub-style table-top game (not shown) which a player can operate preferably while sitting. As illustrated by the different configurations shown in FIGS. 1A and 1B, the gaming device may have varying cabinet and display configurations.

Figure 2A:
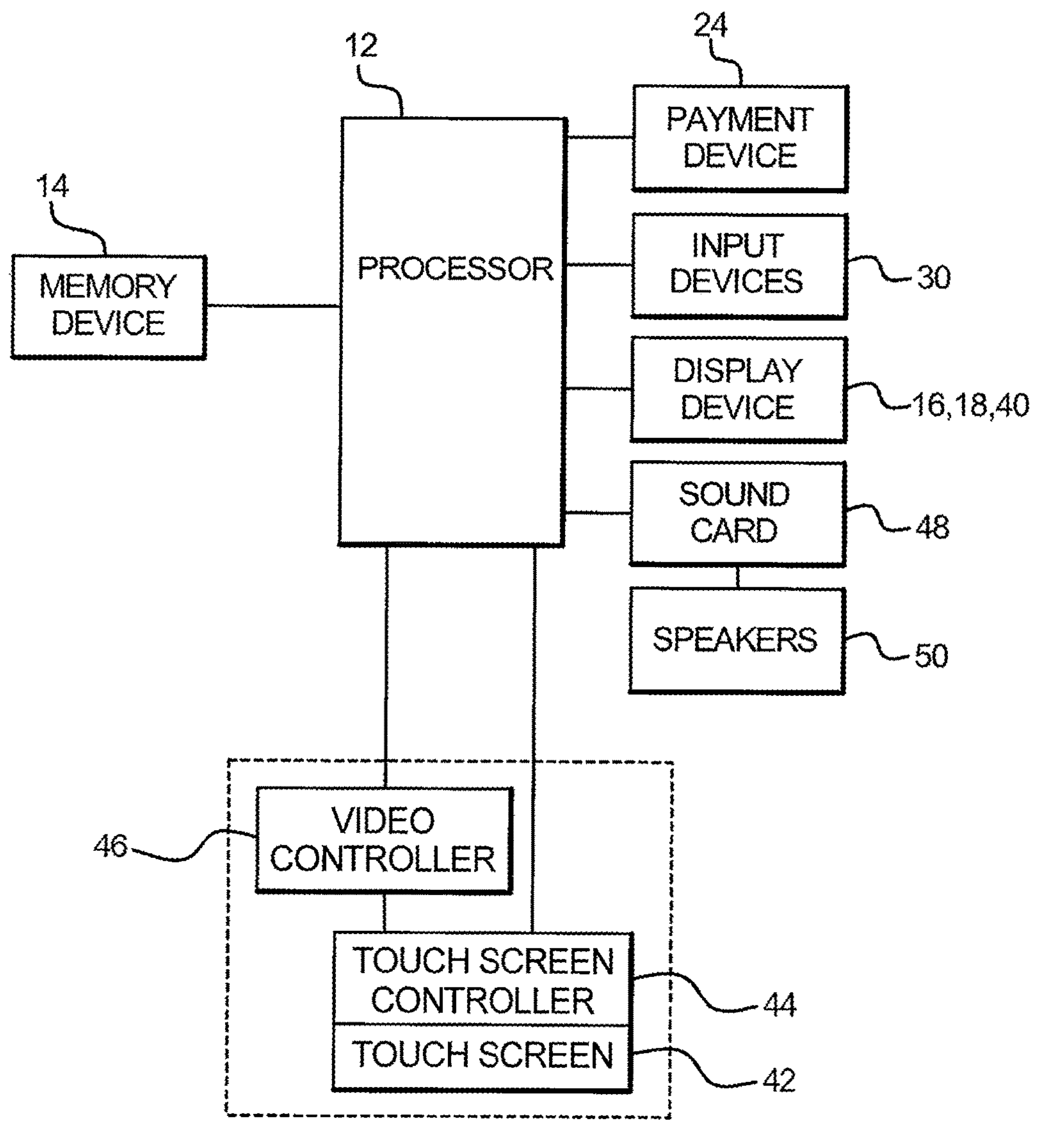
FIG. 2A is a schematic block diagram of one embodiment of an electronic configuration for one of the gaming devices disclosed herein.

In one embodiment, as illustrated in FIG. 2A, the gaming device preferably includes at least one processor 12, such as a microprocessor, a microcontroller-based platform, a suitable integrated circuit or one or more application-specific integrated circuits (ASIC's). The processor is in communication with or operable to access or to exchange signals with at least one data storage or memory device 14. In one embodiment, the processor and the memory device reside within the cabinet of the gaming device. The memory device stores program code and instructions, executable by the processor, to control the gaming device. The memory device also stores other data such as image data, event data, player input data, random or pseudo-random number generators, pay-table data or information, and applicable game rules that relate to the play of the gaming device. In one embodiment, the memory device includes random access memory (RAM), which can include non-volatile RAM (NVRAM), magnetic RAM (MRAM), ferroelectric RAM (FeRAM), and other forms as commonly understood in the gaming industry. In one embodiment, the memory device includes read only memory (ROM). In one embodiment, the memory device includes flash memory and/or EEPROM (electrically erasable programmable read only memory). Any other suitable magnetic, optical, and/or semiconductor memory may operate in conjunction with the gaming device disclosed herein.

In one embodiment, part or all of the program code and/or operating data described above can be stored in a detachable or removable memory device, including, but not limited to, a suitable cartridge, disk, CD ROM, DVD, or USB memory device. In other embodiments, part or all of the program code and/or operating data described above can be downloaded to the memory device through a suitable network.

In one embodiment, an operator or a player can use such a removable memory device in a desktop computer, a laptop computer, a personal digital assistant (PDA), a portable computing device, or another computerized platform to implement the present disclosure. In one embodiment, the gaming device or gaming machine disclosed herein is operable over a wireless network, for example part of a wireless gaming system. In this embodiment, the gaming machine may be a hand-held device, a mobile device, or any other suitable wireless device that enables a player to play any suitable game at a variety of different locations. It should be appreciated that a gaming device or gaming machine as disclosed herein may be a device that has obtained approval from a regulatory gaming commission or a device that has not obtained approval from a regulatory gaming commission. It should be appreciated that the processor and memory device may be collectively referred to herein as a "computer" or "controller."

In one embodiment, as discussed in more detail below, the gaming device randomly generates awards and/or other game outcomes based on probability data. In one such embodiment, this random determination is provided through utilization of a random number generator (RNG), such as a true random number generator, a pseudo random number generator, or other suitable randomization process. In one embodiment, each award or other game outcome is associated with a probability and the gaming device generates the award or other game outcome to be provided to the player based on the associated probabilities. In this embodiment, since the gaming device generates outcomes randomly or based upon one or more probability calculations, there is no certainty that the gaming device will ever provide the player with any specific award or other game outcome.

In another embodiment, as discussed in more detail below, the gaming device employs a predetermined or finite set or pool of awards or other game outcomes. In this embodiment, as each award or other game outcome is provided to the player, the gaming device flags or removes the provided award or other game outcome from the predetermined set or pool. Once flagged or removed from the set or pool, the specific provided award or other game outcome from that specific pool cannot be provided to the player again. This type of gaming device provides players with all of the available awards or other game outcomes over the course of the play cycle and guarantees the amount of actual wins and losses.

In another embodiment, as discussed below, upon a player initiating game play at the gaming device, the gaming device enrolls in a bingo game. In this embodiment, a bingo server calls the bingo balls that result in a specific bingo game outcome. The resultant game outcome is communicated to the individual gaming device to be provided to a player. In one embodiment, this bingo outcome is displayed to the player as a bingo game and/or in any form in accordance with the present disclosure.

In one embodiment, as illustrated in FIG. 2A, the gaming device includes one or more display devices controlled by the processor. The display devices are preferably connected to or mounted on the cabinet of the gaming device. The embodiment shown in FIG. 1A includes a central display device 16 which displays a primary game. This display device may also display any suitable secondary game associated with the primary game as well as information relating to the primary or secondary game. The alternative embodiment shown in FIG. 1B includes a central display device 16 and an upper display device 18. The upper display device may display the primary game, any suitable secondary game associated or not associated with the primary game and/or information relating to the primary or secondary game. These display devices may also serve as digital glass operable to advertise games or other aspects of the gaming establishment. As seen in FIGS. 1A and 1B, in one embodiment, the gaming device includes a credit display 20 which displays a player's current number of credits, cash, account balance, or the equivalent. In one embodiment, the gaming device includes a bet display 22 which displays a player's amount wagered. In one embodiment, as described in more detail below, the gaming device includes a player tracking display 40 which displays information regarding a player's play tracking status.

In another embodiment, at least one display device may be a mobile display device, such as a PDA or tablet PC, that enables play of at least a portion of the primary or secondary game at a location remote from the gaming device.

The display devices may include, without limitation, a monitor, a television display, a plasma display, a liquid crystal display (LCD) a display based on light emitting diodes (LEDs), a display based on a plurality of organic light-emitting diodes (OLEDs), a display based on polymer light-emitting diodes (PLEDs), a display based on a plurality of surface-conduction electron-emitters (SEDs), a display including a projected and/or reflected image, or any other suitable electronic device or display mechanism. In one embodiment, as described in more detail below, the display device includes a touch-screen with an associated touch-screen controller. The display devices may be of any suitable size and configuration, such as a square, a rectangle or an elongated rectangle.

The display devices of the gaming device are configured to display at least one and preferably a plurality of game or other suitable images, symbols and indicia such as any visual representation or exhibition of the movement of objects such as mechanical, virtual, or video reels and wheels, dynamic lighting, video images, images of people, characters, places, things, faces of cards, and the like.

In one alternative embodiment, the symbols, images and indicia displayed on or of the display device may be in mechanical form. That is, the display device may include any electromechanical device, such as one or more mechanical objects, such as one or more rotatable wheels, reels, or dice, configured to display at least one or a plurality of game or other suitable images, symbols or indicia.

As illustrated in FIG. 2A, in one embodiment, the gaming device includes at least one payment device 24 in communication with the processor. As seen in FIGS. 1A and 1B, a payment device such as a payment acceptor includes a note, ticket or bill acceptor 28 wherein the player inserts paper money, a ticket, or voucher and a coin slot 26 where the player inserts money, coins, or tokens. In other embodiments, payment devices such as readers or validators for credit cards, debit cards or credit slips may accept payment. In one embodiment, a player may insert an identification card into a card reader of the gaming device. In one embodiment, the identification card is a smart card having a programmed microchip or a magnetic strip coded with a player's identification, credit totals (or related data), and other relevant information. In another embodiment, a player may carry a portable device, such as a cell phone, a radio frequency identification tag, or any other suitable wireless device, which communicates a player's identification, credit totals (or related data), and other relevant information to the gaming device. In one embodiment, money may be transferred to a gaming device through electronic funds transfer. When a player funds the gaming device, the processor determines the amount of funds entered and displays the corresponding amount on the credit or other suitable display as described above.

As seen in FIGS. 1A, 1B, and 2A, in one embodiment the gaming device includes at least one and preferably a plurality of input devices 30 in communication with the processor. The input devices can include any suitable device which enables the player to produce an input signal which is received by the processor. In one embodiment, after appropriate funding of the gaming device, the input device is a game activation device, such as a play button 32 or a pull arm (not shown) which is used by the player to start any primary game or sequence of events in the gaming device. The play button can be any suitable play activator such as a bet one button, a max bet button, or a repeat the bet button. In one embodiment, upon appropriate funding, the gaming device begins the game play automatically. In another embodiment, upon the player engaging one of the play buttons, the gaming device automatically activates game play.

In one embodiment, one input device is a bet one button. The player places a bet by pushing the bet one button. The player can increase the bet by one credit each time the player pushes the bet one button. When the player pushes the bet one button, the number of credits shown in the credit display preferably decreases by one, and the number of credits shown in the bet display preferably increases by one. In another embodiment, one input device is a bet max button (not shown) which enables the player to bet the maximum wager permitted for a game of the gaming device.

In one embodiment, one input device is a cash out button 34. The player may push the cash out button and cash out to receive a cash payment or other suitable form of payment corresponding to the number of remaining credits. In one embodiment, when the player cashes out, a payment device, such as a ticket, payment, or note generator 36 prints or otherwise generates a ticket or credit slip to provide to the player. The player receives the ticket or credit slip and may redeem the value associated with the ticket or credit slip via a cashier (or other suitable redemption system). In another embodiment, when the player cashes out, the player receives the coins or tokens in a coin payout tray. It should be appreciated that any suitable payout mechanisms, such as funding to the player's electronically recordable identification card, may be implemented in accordance with the gaming device disclosed herein.

In one embodiment, as mentioned above and as seen in FIG. 2A, one input device is a touch-screen 42 coupled with a touch-screen controller 44 or some other touch-sensitive display overlay to allow for player interaction with the images on the display. The touch-screen and the touch-screen controller are connected to a video controller 46. A player can make decisions and input signals into the gaming device by touching the touch-screen at the appropriate locations. One such input device is a conventional touch-screen button panel.

The gaming device may further include a plurality of communication ports for enabling communication of the processor with external peripherals, such as external video sources, expansion buses, game or other displays, a SCSI port, or a keypad.

In one embodiment, as seen in FIG. 2A, the gaming device includes a sound generating device controlled by one or more sounds cards 48 which function in conjunction with the processor. In one embodiment, the sound generating device includes at least one and preferably a plurality of speakers 50 or other sound generating hardware and/or software for generating sounds, such as by playing music for the primary and/or secondary game or by playing music for other modes of the gaming device, such as an attract mode. In one embodiment, the gaming device provides dynamic sounds coupled with attractive multimedia images displayed on one or more of the display devices to provide an audio-visual representation or to otherwise display full-motion video with sound to attract players to the gaming device. During idle periods, the gaming device may display a sequence of audio and/or visual attraction messages to attract potential players to the gaming device. The videos may also be customized to provide any appropriate information.

In one embodiment, the gaming machine may include a sensor, such as a camera, in communication with the processor (and possibly controlled by the processor), that is selectively positioned to acquire an image of a player actively using the gaming device and/or the surrounding area of the gaming device. In one embodiment, the camera may be configured to selectively acquire still or moving (e.g., video) images and may be configured to acquire the images in an analog, digital, or other suitable format. The display devices may be configured to display the image acquired by the camera as well as to display the visible manifestation of the game in split screen or picture-in-picture fashion. For example, the camera may acquire an image of the player and the processor may incorporate that image into the primary and/or secondary game as a game image, symbol or indicia.

Gaming device 10 can incorporate any suitable wagering game as the primary or base game. The gaming machine or device may include some or all of the features of conventional gaming machines or devices. The primary or base game may comprise any suitable reel-type game, card game, cascading or falling symbol game, number game, or other game of chance susceptible to representation in an electronic or electromechanical form, which in one embodiment produces a random outcome based on probability data at the time of or after placement of a wager. That is, different primary wagering games, such as video poker games, video blackjack games, video keno, video bingo or any other suitable primary or base game may be implemented.

In one embodiment, as illustrated in FIGS. 1A and 1B, a base or primary game may be a slot game with one or more paylines 52. The paylines may be horizontal, vertical, circular, diagonal, angled or any combination thereof. In this embodiment, the gaming device includes at least one and preferably a plurality of reels 54, such as three to five reels 54, in either electromechanical form with mechanical rotating reels or video form with simulated reels and movement thereof. In one embodiment, an electromechanical slot machine includes a plurality of adjacent, rotatable reels which may be combined and operably coupled with an electronic display of any suitable type. In another embodiment, if the reels 54 are in video form, one or more of the display devices, as described above, displays the plurality of simulated video reels 54. Each reel 54 displays a plurality of indicia or symbols, such as bells, hearts, fruits, numbers, letters, bars, or other images which preferably correspond to a theme associated with the gaming device. In another embodiment, one or more of the reels are independent reels or unisymbol reels. In this embodiment, each independent or unisymbol reel generates and displays one symbol to the player. In one embodiment, the gaming device awards prizes after the reels of the primary game stop spinning if specified types and/or configurations of indicia or symbols occur on an active payline or otherwise occur in a winning pattern, occur on the requisite number of adjacent reels and/or occur in a scatter pay arrangement.

In an alternative embodiment, rather than determining any outcome to provide to the player by analyzing the symbols generated on any wagered upon paylines as described above, the gaming device determines any outcome to provide to the player based on the number of associated symbols which are generated in active symbol positions on the requisite number of adjacent reels (i.e., not on paylines passing through any displayed winning symbol combinations). In this embodiment, if a winning symbol combination is generated on the reels, the gaming device provides the player one award for that occurrence of the generated winning symbol combination. For example, if one winning symbol combination is generated on the reels, the gaming device will provide a single award to the player for that winning symbol combination (i.e., not based on the number of paylines that would have passed through that winning symbol combination). It should be appreciated that because a gaming device that enables wagering on ways to win provides the player one award for a single occurrence of a winning symbol combination and a gaming device with paylines may provide the player more than one award for the same occurrence of a single winning symbol combination (i.e., if a plurality of paylines each pass through the same winning symbol combination), it is possible to provide a player at a ways to win gaming device with more ways to win for an equivalent bet or wager on a traditional slot gaming device with paylines.

In one embodiment, the total number of ways to win is determined by multiplying the number of symbols generated in active symbol positions on a first reel by the number of symbols generated in active symbol positions on a second reel by the number of symbols generated in active symbol positions on a third reel and so on for each reel of the gaming device with at least one symbol generated in an active symbol position. For example, a three reel gaming device with three symbols generated in active symbol positions on each reel includes 27 ways to win (i.e., 3 symbols on the first reel×3 symbols on the second reel×3 symbols on the third reel). A four reel gaming device with three symbols generated in active symbol positions on each reel includes 81 ways to win (i.e., 3 symbols on the first reel×3 symbols on the second reel×3 symbols on the third reel×3 symbols on the fourth reel). A five reel gaming device with three symbols generated in active symbol positions on each reel includes 243 ways to win (i.e., 3 symbols on the first reel×3 symbols on the second reel×3 symbols on the third reel×3 symbols on the fourth reel×3 symbols on the fifth reel). It should be appreciated that modifying the number of generated symbols by either modifying the number of reels or modifying the number of symbols generated in active symbol positions by one or more of the reels modifies the number of ways to win.

In another embodiment, the gaming device enables a player to wager on and thus activate symbol positions. In one such embodiment, the symbol positions are on the reels. In this embodiment, if based on the player's wager, a reel is activated, then each of the symbol positions of that reel will be activated and each of the active symbol positions will be part of one or more of the ways to win. In one embodiment, if based on the player's wager, a reel is not activated, then a designated number of default symbol positions, such as a single symbol position of the middle row of the reel, will be activated and the default symbol position(s) will be part of one or more of the ways to win. This type of gaming machine enables a player to wager on one, more than one or all of the reels and the processor of the gaming device uses the number of wagered on reels to determine the active symbol positions and the number of possible ways to win. In alternative embodiments, (1) no symbols are displayed as generated at any of the inactive symbol positions, or (2) any symbols generated at any inactive symbol positions may be displayed to the player but suitably shaded or otherwise designated as inactive.

In one embodiment wherein a player wagers on one or more reels, a player's wager of one credit may activate each of the three symbol positions on a first reel, wherein one default symbol position is activated on each of the remaining four reels. In this example, as described above, the gaming device provides the player three ways to win (i.e., 3 symbols on the first reel×1 symbol on the second reel×1 symbol on the third reel×1 symbol on the fourth reel×1 symbol on the fifth reel). In another example, a player's wager of nine credits may activate each of the three symbol positions on a first reel, each of the three symbol positions on a second reel and each of the three symbol positions on a third reel wherein one default symbol position is activated on each of the remaining two reels. In this example, as described above, the gaming device provides the player twenty-seven ways to win (i.e., 3 symbols on the first reel×3 symbols on the second reel×3 symbols on the third reel×1 symbol on the fourth reel×1 symbol on the fifth reel).

In one embodiment, to determine any award(s) to provide to the player based on the generated symbols, the gaming device individually determines if a symbol generated in an active symbol position on a first reel forms part of a winning symbol combination with or is otherwise suitably related to a symbol generated in an active symbol position on a second reel. In this embodiment, the gaming device classifies each pair of symbols which form part of a winning symbol combination (i.e., each pair of related symbols) as a string of related symbols. For example, if active symbol positions include a first cherry symbol generated in the top row of a first reel and a second cherry symbol generated in the bottom row of a second reel, the gaming device classifies the two cherry symbols as a string of related symbols because the two cherry symbols form part of a winning symbol combination.

After determining if any strings of related symbols are formed between the symbols on the first reel and the symbols on the second reel, the gaming device determines if any of the symbols from the next adjacent reel should be added to any of the formed strings of related symbols. In this embodiment, for a first of the classified strings of related symbols, the gaming device determines if any of the symbols generated by the next adjacent reel form part of a winning symbol combination or are otherwise related to the symbols of the first string of related symbols. If the gaming device determines that a symbol generated on the next adjacent reel is related to the symbols of the first string of related symbols, that symbol is subsequently added to the first string of related symbols. For example, if the first string of related symbols is the string of related cherry symbols and a related cherry symbol is generated in the middle row of the third reel, the gaming device adds the related cherry symbol generated on the third reel to the previously classified string of cherry symbols.

On the other hand, if the gaming device determines that no symbols generated on the next adjacent reel are related to the symbols of the first string of related symbols, the gaming device marks or flags such string of related symbols as complete. For example, if the first string of related symbols is the string of related cherry symbols and none of the symbols of the third reel are related to the cherry symbols of the previously classified string of cherry symbols, the gaming device marks or flags the string of two cherry symbols as complete.

After either adding a related symbol to the first string of related symbols or marking the first string of related symbols as complete, the gaming device proceeds as described above for each of the remaining classified strings of related symbols which were previously classified or formed from related symbols on the first and second reels.

After analyzing each of the remaining strings of related symbols, the gaming device determines, for each remaining pending or incomplete string of related symbols, if any of the symbols from the next adjacent reel, if any, should be added to any of the previously classified strings of related symbols. This process continues until either each string of related symbols is complete or there are no more adjacent reels of symbols to analyze. In this embodiment, where there are no more adjacent reels of symbols to analyze, the gaming device marks each of the remaining pending strings of related symbols as complete.

When each of the strings of related symbols is marked complete, the gaming device compares each of the strings of related symbols to an appropriate paytable and provides the player any award associated with each of the completed strings of symbols. It should be appreciated that the player is provided one award, if any, for each string of related symbols generated in active symbol positions (i.e., as opposed to a quantity of awards being based on how many paylines that would have passed through each of the strings of related symbols in active symbol positions).

In one embodiment, a base or primary game may be a poker game wherein the gaming device enables the player to play a conventional game of video draw poker and initially deals five cards all face up from a virtual deck of fifty-two cards. Cards may be dealt as in a traditional game of cards or in the case of the gaming device, the cards may be randomly selected from a predetermined number of cards. If the player wishes to draw, the player selects the cards to hold via one or more input devices, such as by pressing related hold buttons or via the touch screen. The player then presses the deal button and the unwanted or discarded cards are removed from the display and the gaming machine deals the replacement cards from the remaining cards in the deck. This results in a final five-card hand. The gaming device compares the final five-card hand to a payout table which utilizes conventional poker hand rankings to determine the winning hands. The gaming device provides the player with an award based on a winning hand and the number of credits the player wagered.

In another embodiment, the base or primary game may be a multi-hand version of video poker. In this embodiment, the gaming device deals the player at least two hands of cards. In one such embodiment, the cards are the same cards. In one embodiment each hand of cards is associated with its own deck of cards. The player chooses the cards to hold in a primary hand. The held cards in the primary hand are also held in the other hands of cards. The remaining non-held cards are removed from each hand displayed and for each hand replacement cards are randomly dealt into that hand. Since the replacement cards are randomly dealt independently for each hand, the replacement cards for each hand will usually be different. The poker hand rankings are then determined hand by hand against a payout table and awards are provided to the player.

In one embodiment, a base or primary game may be a keno game wherein the gaming device displays a plurality of selectable indicia or numbers on at least one of the display devices. In this embodiment, the player selects at least one bit potentially a plurality of the selectable indicia or numbers via an input device such as a touch screen. The gaming device then displays a series of drawn numbers and determine an amount of matches, if any, between the player's selected numbers and the gaming device's drawn numbers. The player is provided an award based on the amount of matches, if any, based on the amount of determined matches and the number of numbers drawn.

In one embodiment, in addition to winning credits or other awards in a base or primary game, the gaming device may also give players the opportunity to win credits in a bonus or secondary game or in a bonus or secondary round. The bonus or secondary game enables the player to obtain a prize or payout in addition to the prize or payout, if any, obtained from the base or primary game. In general, a bonus or secondary game produces a significantly higher level of player excitement than the base or primary game because it provides a greater expectation of winning than the base or primary game, and is accompanied with more attractive or unusual features than the base or primary game. In one embodiment, the bonus or secondary game may be any type of suitable game, either similar to or completely different from the base or primary game.

In one embodiment, the triggering event or qualifying condition may be a selected outcome in the primary game or a particular arrangement of one or more indicia on a display device in the primary game, such as the number seven appearing on three adjacent reels along a payline in the primary slot game embodiment seen in FIGS. 1A and 1B. In other embodiments, the triggering event or qualifying condition occurs based on exceeding a certain amount of game play (such as number of games, number of credits, amount of time), or reaching a specified number of points earned during game play.

In another embodiment, the gaming device processor 12 or central server 56 randomly provides the player one or more plays of one or more secondary games. In one such embodiment, the gaming device does not provide any apparent reason to the player for qualifying to play a secondary or bonus game. In this embodiment, qualifying for a bonus game is not triggered by an event in or based specifically on any of the plays of any primary game. That is, the gaming device may simply qualify a player to play a secondary game without any explanation or alternatively with simple explanations. In another embodiment, the gaming device (or central server) qualifies a player for a secondary game at least partially based on a game triggered or symbol triggered event, such as at least partially based on the play of a primary game.

In one embodiment, the gaming device includes a program which will automatically begin a bonus round after the player has achieved a triggering event or qualifying condition in the base or primary game. In another embodiment, after a player has qualified for a bonus game, the player may subsequently enhance his/her bonus game participation through continued play on the base or primary game. Thus, for each bonus qualifying event, such as a bonus symbol, that the player obtains, a given number of bonus game wagering points or credits may be accumulated in a "bonus meter" programmed to accrue the bonus wagering credits or entries toward eventual participation in a bonus game. The occurrence of multiple such bonus qualifying events in the primary game may result in an arithmetic or exponential increase in the number of bonus wagering credits awarded. In one embodiment, the player may redeem extra bonus wagering credits during the bonus game to extend play of the bonus game.

In one embodiment, no separate entry fee or buy-in for a bonus game is needed. That is, a player may not purchase entry into a bonus game; rather they must win or earn entry through play of the primary game, thus encouraging play of the primary game. In another embodiment, qualification of the bonus or secondary game is accomplished through a simple "buy-in" by the player—for example, if the player has been unsuccessful at qualifying through other specified activities. In another embodiment, the player must make a separate side-wager on the bonus game or wager a designated amount in the primary game to qualify for the secondary game. In this embodiment, the secondary game triggering event must occur and the side-wager (or designated primary game wager amount) must have been placed to trigger the secondary game.

Figure 2B:
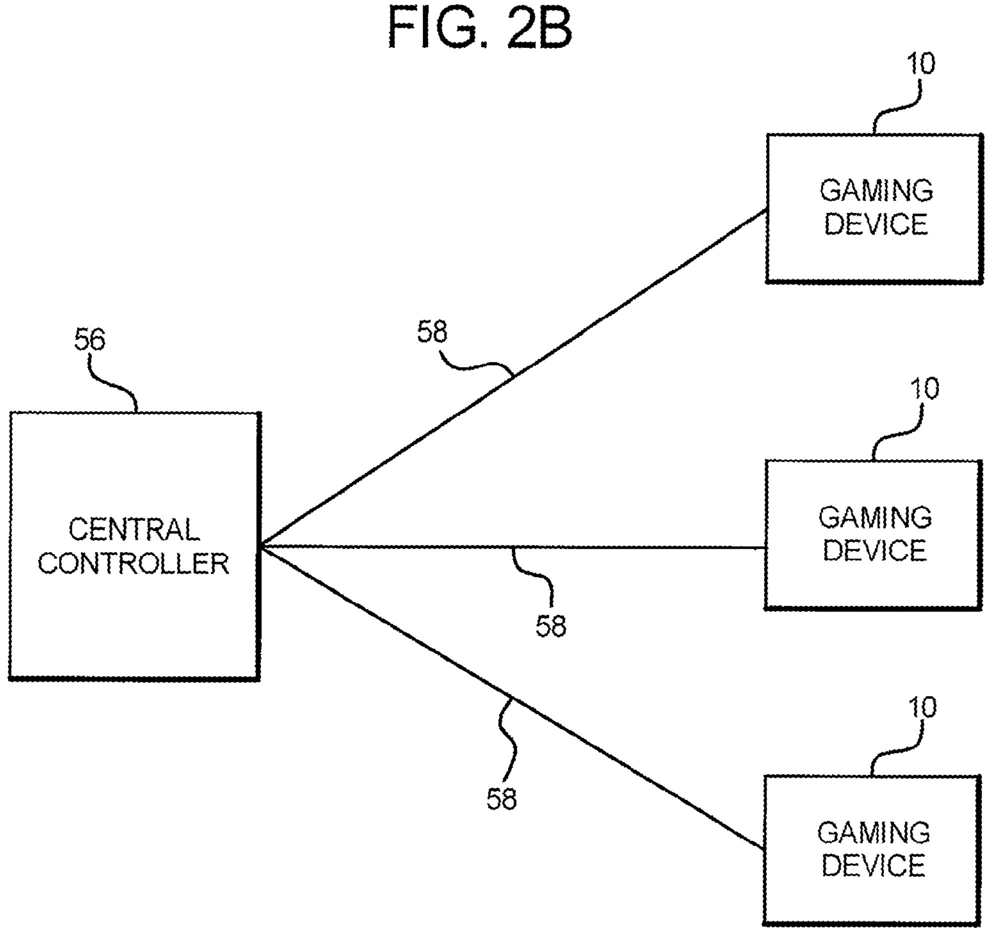
FIG. 2B is a schematic block diagram of one embodiment of a gaming system network configuration including a plurality of gaming devices disclosed herein.

In one embodiment, as illustrated in FIG. 2B, one or more of the gaming devices 10 are in communication with each other and/or at least one central server, central controller or remote host 56 through a data network or remote communication link 58. In this embodiment, the central server, central controller or remote host is any suitable server or computing device which includes at least one processor and at least one memory or storage device. In different such embodiments, the central server is a progressive controller or a processor of one of the gaming devices in the gaming system. In these embodiments, the processor of each gaming device is designed to transmit and receive events, messages, commands, or any other suitable data or signal between the individual gaming device and the central server. The gaming device processor is operable to execute such communicated events, messages, or commands in conjunction with the operation of the gaming device. Moreover, the processor of the central server is designed to transmit and receive events, messages, commands, or any other suitable data or signal between the central server and each of the individual gaming devices. The central server processor is operable to execute such communicated events, messages, or commands in conjunction with the operation of the central server. It should be appreciated that one, more or each of the functions of the central controller as disclosed herein may be performed by one or more gaming device processors. It should be further appreciated that one, more or each of the functions of one or more gaming device processors as disclosed herein may be performed by the central controller.

In one embodiment, the game outcome provided to the player is determined by a central server or controller and provided to the player at the gaming device. In this embodiment, each of a plurality of such gaming devices are in communication with the central server or controller. Upon a player initiating game play at one of the gaming devices, the initiated gaming device communicates a game outcome request to the central server or controller.

In one embodiment, the central server or controller receives the game outcome request and randomly generates a game outcome for the primary game based on probability data. In another embodiment, the central server or controller randomly generates a game outcome for the secondary game based on probability data. In another embodiment, the central server or controller randomly generates a game outcome for both the primary game and the secondary game based on probability data. In this embodiment, the central server or controller is capable of storing and utilizing program code or other data similar to the processor and memory device of the gaming device.

In an alternative embodiment, the central server or controller maintains one or more predetermined pools or sets of predetermined game outcomes. In this embodiment, the central server or controller receives the game outcome request and independently selects a predetermined game outcome from a set or pool of game outcomes. The central server or controller flags or marks the selected game outcome as used. Once a game outcome is flagged as used, it is prevented from further selection from the set or pool and cannot be selected by the central controller or server upon another wager. The provided game outcome can include a primary game outcome, a secondary game outcome, primary and secondary game outcomes, or a series of game outcomes such as free games.

The central server or controller communicates the generated or selected game outcome to the initiated gaming device. The gaming device receives the generated or selected game outcome and provides the game outcome to the player. In an alternative embodiment, how the generated or selected game outcome is to be presented or displayed to the player, such as a reel symbol combination of a slot machine or a hand of cards dealt in a card game, is also determined by the central server or controller and communicated to the initiated gaming device to be presented or displayed to the player. Central production or control can assist a gaming establishment or other entity in maintaining appropriate records, controlling gaming, reducing and preventing cheating or electronic or other errors, reducing or eliminating win-loss volatility, and the like.

In another embodiment, a predetermined game outcome value is determined for each of a plurality of linked or networked gaming devices based on the results of a bingo, keno, or lottery game. In this embodiment, each individual gaming device utilizes one or more bingo, keno, or lottery games to determine the predetermined game outcome value provided to the player for the interactive game played at that gaming device. In one embodiment, the bingo, keno, or lottery game is displayed to the player. In another embodiment, the bingo, keno or lottery game is not displayed to the player, but the results of the bingo, keno, or lottery game determine the predetermined game outcome value for the primary or secondary game.

In the various bingo embodiments, as each gaming device is enrolled in the bingo game, such as upon an appropriate wager or engaging an input device, the enrolled gaming device is provided or associated with a different bingo card. Each bingo card consists of a matrix or array of elements, wherein each element is designated with a separate indicia, such as a number. It should be appreciated that each different bingo card includes a different combination of elements. For example, if four bingo cards are provided to four enrolled gaming devices, the same element may be present on all four of the bingo cards while another element may solely be present on one of the bingo cards.

In operation of these embodiments, upon providing or associating a different bingo card with each of a plurality of enrolled gaming devices, the central controller randomly selects or draws, one at a time, a plurality of the elements. As each element is selected, a determination is made for each gaming device as to whether the selected element is present on the bingo card provided to that enrolled gaming device. This determination can be made by the central controller, the gaming device, a combination of the two, or in any other suitable manner. If the selected element is present on the bingo card provided to that enrolled gaming device, that selected element on the provided bingo card is marked or flagged. This process of selecting elements and marking any selected elements on the provided bingo cards continues until one or more predetermined patterns are marked on one or more of the provided bingo cards. It should be appreciated that in one embodiment, the gaming device requires the player to engage a daub button (not shown) to initiate the process of the gaming device marking or flagging any selected elements.

After one or more predetermined patterns are marked on one or more of the provided bingo cards, a game outcome is determined for each of the enrolled gaming devices based, at least in part, on the selected elements on the provided bingo cards. As described above, the game outcome determined for each gaming device enrolled in the bingo game is utilized by that gaming device to determine the predetermined game outcome provided to the player. For example, a first gaming device to have selected elements marked in a predetermined pattern is provided a first outcome of win $10 which will be provided to a first player regardless of how the first player plays in a first game, and a second gaming device to have selected elements marked in a different predetermined pattern is provided a second outcome of win $2 which will be provided to a second player regardless of how the second player plays a second game. It should be appreciated that as the process of marking selected elements continues until one or more predetermined patterns are marked, this embodiment ensures that at least one bingo card will win the bingo game and thus at least one enrolled gaming device will provide a predetermined winning game outcome to a player. It should be appreciated that other suitable methods for selecting or determining one or more predetermined game outcomes may be employed.

In one example of the above-described embodiment, the predetermined game outcome may be based on a supplemental award in addition to any award provided for winning the bingo game as described above. In this embodiment, if one or more elements are marked in supplemental patterns within a designated number of drawn elements, a supplemental or intermittent award or value associated with the marked supplemental pattern is provided to the player as part of the predetermined game outcome. For example, if the four corners of a bingo card are marked within the first twenty selected elements, a supplemental award of $10 is provided to the player as part of the predetermined game outcome. It should be appreciated that in this embodiment, the player of a gaming device may be provided a supplemental or intermittent award regardless of whether the enrolled gaming device's provided bingo card wins or does not win the bingo game as described above.

In another embodiment, one or more of the gaming devices are in communication with a central server or controller for monitoring purposes only. That is, each individual gaming device randomly generates the game outcomes to be provided to the player and the central server or controller monitors the activities and events occurring on the plurality of gaming devices. In one embodiment, the gaming network includes a real-time or on-line accounting and gaming information system operably coupled to the central server or controller. The accounting and gaming information system of this embodiment includes a player database for storing player profiles, a player tracking module for tracking players and a credit system for providing automated casino transactions.

In one embodiment, the gaming device disclosed herein is associated with or otherwise integrated with one or more player tracking systems. Player tracking systems enable gaming establishments to recognize the value of customer loyalty through identifying frequent customers and rewarding them for their patronage. In one embodiment, the gaming device and/or player tracking system tracks any player's gaming activity at the gaming device. In one such embodiment, the gaming device includes at least one card reader 38 in communication with the processor. In this embodiment, a player is issued a player identification card which has an encoded player identification number that uniquely identifies the player. When a player inserts their playing tracking card into the card reader to begin a gaming session, the card reader reads the player identification number off the player tracking card to identify the player. The gaming device and/or associated player tracking system timely tracks any suitable information or data relating to the identified player's gaming session. Directly or via the central controller, the gaming device processor communicates such information to the player tracking system. The gaming device and/or associated player tracking system also timely tracks when a player removes their player tracking card when concluding play for that gaming session. In another embodiment, rather than requiring a player to insert a player tracking card, the gaming device utilizes one or more portable devices carried by a player, such as a cell phone, a radio frequency identification tag or any other suitable wireless device to track when a player begins and ends a gaming session. In another embodiment, the gaming device utilizes any suitable biometric technology or ticket technology to track when a player begins and ends a gaming session.

During one or more gaming sessions, the gaming device and/or player tracking system tracks any suitable information or data, such as any amounts wagered, average wager amounts, and/or the time at which these wagers are placed. In different embodiments, for one or more players, the player tracking system includes the player's account number, the player's card number, the player's first name, the player's surname, the player's preferred name, the player's player tracking ranking, any promotion status associated with the player's player tracking card, the player's address, the player's birthday, the player's anniversary, the player's recent gaming sessions, or any other suitable data. In one embodiment, such tracked information and/or any suitable feature associated with the player tracking system is displayed on a player tracking display 40. In another embodiment, such tracked information and/or any suitable feature associated with the player tracking system is displayed via one or more service windows (not shown) which are displayed on the central display device and/or the upper display device.

In one embodiment, a plurality of the gaming devices are capable of being connected together through a data network. In one embodiment, the data network is a local area network (LAN), in which one or more of the gaming devices are substantially proximate to each other and an on-site central server or controller as in, for example, a gaming establishment or a portion of a gaming establishment. In another embodiment, the data network is a wide area network (WAN) in which one or more of the gaming devices are in communication with at least one off-site central server or controller. In this embodiment, the plurality of gaming devices may be located in a different part of the gaming establishment or within a different gaming establishment than the off-site central server or controller. Thus, the WAN may include an off-site central server or controller and an off-site gaming device located within gaming establishments in the same geographic area, such as a city or state. The WAN gaming system may be substantially identical to the LAN gaming system described above, although the number of gaming devices in each system may vary relative to one another.

In another embodiment, the data network is an internet or intranet. In this embodiment, the operation of the gaming device can be viewed at the gaming device with at least one internet browser. In this embodiment, operation of the gaming device and accumulation of credits may be accomplished with only a connection to the central server or controller (the internet/intranet server) through a conventional phone or other data transmission line, digital subscriber line (DSL), T-1 line, coaxial cable, fiber optic cable, or other suitable connection. In this embodiment, players may access an internet game page from any location where an internet connection and computer or other internet facilitator is available. The expansion in the number of computers and number and speed of internet connections in recent years increases opportunities for players to play from an ever-increasing number of remote sites. It should be appreciated that the enhanced bandwidth of digital wireless communications may render such technology suitable for some or all communications, particularly if such communications are encrypted. Higher data transmission speeds may be useful for enhancing the sophistication and response of the display and interaction with the player.

As mentioned above, in one embodiment, the present disclosure may be employed in a server-based gaming system. In one such embodiment, as described above, one or more gaming devices are in communication with a central server or controller. The central server or controller may be any suitable server or computing device which includes at least one processor and a memory or storage device. In alternative embodiments, the central server is a progressive controller or another gaming machine in the gaming system. In one embodiment, the memory device of the central server stores different game programs and instructions, executable by a gaming device processor, to control the gaming device. Each executable game program represents a different game or type of game which may be played on one or more of the gaming devices in the gaming system. Such different games may include the same or substantially the same game play with different pay tables. In different embodiments, the executable game program is for a primary game, a secondary game or both. In another embodiment, the game program may be executable as a secondary game to be played simultaneous with the play of a primary game (which may be downloaded to or fixed on the gaming device) or vice versa.

In this embodiment, each gaming device at least includes one or more display devices and/or one or more input devices for interaction with a player. A local processor, such as the above-described gaming device processor or a processor of a local server, is operable with the display device(s) and/or the input device(s) of one or more of the gaming devices.

In operation, the central controller is operable to communicate one or more of the stored game programs to at least one local processor. In different embodiments, the stored game programs are communicated or delivered by embedding the communicated game program in a device or a component (e.g., a microchip to be inserted in a gaming device), writing the game program on a disc or other media, or downloading or streaming the game program over a dedicated data network, internet, or a telephone line. After the stored game programs are communicated from the central server, the local processor executes the communicated program to facilitate play of the communicated program by a player through the display device(s) and/or input device(s) of the gaming device. That is, when a game program is communicated to a local processor, the local processor changes the game or type of game played at the gaming device.

In another embodiment, a plurality of gaming devices at one or more gaming sites may be networked to the central server in a progressive configuration, as known in the art, wherein a portion of each wager to initiate a base or primary game may be allocated to one or more progressive awards. In one embodiment, a progressive gaming system host site computer is coupled to a plurality of the central servers at a variety of mutually remote gaming sites for providing a multi-site linked progressive automated gaming system. In one embodiment, a progressive gaming system host site computer may serve gaming devices distributed throughout a number of properties at different geographical locations including, for example, different locations within a city or different cities within a state.

In one embodiment, the progressive gaming system host site computer is maintained for the overall operation and control of the progressive gaming system. In this embodiment, a progressive gaming system host site computer oversees the entire progressive gaming system and is the master for computing all progressive jackpots. All participating gaming sites report to, and receive information from, the progressive gaming system host site computer. Each central server computer is responsible for all data communication between the gaming device hardware and software and the progressive gaming system host site computer. In one embodiment, an individual gaming machine may trigger a progressive award win. In another embodiment, a central server (or the progressive gaming system host site computer) determines when a progressive award win is triggered. In another embodiment, an individual gaming machine and a central controller (or progressive gaming system host site computer) work in conjunction with each other to determine when a progressive win is triggered, for example through an individual gaming machine meeting a predetermined requirement established by the central controller.

In one embodiment, a progressive award win is triggered based on one or more game play events, such as a symbol-driven trigger. In other embodiments, the progressive award triggering event or qualifying condition may be achieved by exceeding a certain amount of game play (such as number of games, number of credits, or amount of time), or reaching a specified number of points earned during game play. In another embodiment, a gaming device is randomly or apparently randomly selected to provide a player of that gaming device one or more progressive awards. In one such embodiment, the gaming device does not provide any apparent reasons to the player for winning a progressive award, wherein winning the progressive award is not triggered by an event in or based specifically on any of the plays of any primary game. That is, a player is provided a progressive award without any explanation or alternatively with simple explanations. In another embodiment, a player is provided a progressive award at least partially based on a game triggered or symbol triggered event, such as at least partially based on the play of a primary game.

In one embodiment, one or more of the progressive awards are each funded via a side bet or side wager. In this embodiment, a player must place or wager a side bet to be eligible to win the progressive award associated with the side bet. In one embodiment, the player must place the maximum bet and the side bet to be eligible to win one of the progressive awards. In another embodiment, if the player places or wagers the required side bet, the player may wager at any credit amount during the primary game (i.e., the player need not place the maximum bet and the side bet to be eligible to win one of the progressive awards). In one such embodiment, the greater the player's wager (in addition to the placed side bet), the greater the odds or probability that the player will win one of the progressive awards. It should be appreciated that one or more of the progressive awards may each be funded, at least in part, based on the wagers placed on the primary games of the gaming machines in the gaming system, via a gaming establishment or via any suitable manner.

In another embodiment, one or more of the progressive awards are partially funded via a side-bet or side-wager which the player may make (and which may be tracked via a side-bet meter). In one embodiment, one or more of the progressive awards are funded with only side-bets or side-wagers placed. In another embodiment, one or more of the progressive awards are funded based on player's wagers as described above as well as any side-bets or side-wagers placed.

In one alternative embodiment, a minimum wager level is required for a gaming device to qualify to be selected to obtain one of the progressive awards. In one embodiment, this minimum wager level is the maximum wager level for the primary game in the gaming machine. In another embodiment, no minimum wager level is required for a gaming machine to qualify to be selected to obtain one of the progressive awards.

Group Bonus Event

In one embodiment, a plurality of players at a plurality of linked gaming devices in the gaming system disclosed herein participate in a group gaming environment. In one embodiment, the gaming system maintains that a target total gaming system probability of triggering a group bonus event is reached for the players of the gaming devices in the gaming system regardless of the number of players playing such gaming devices in the gaming system.

Figure 3:
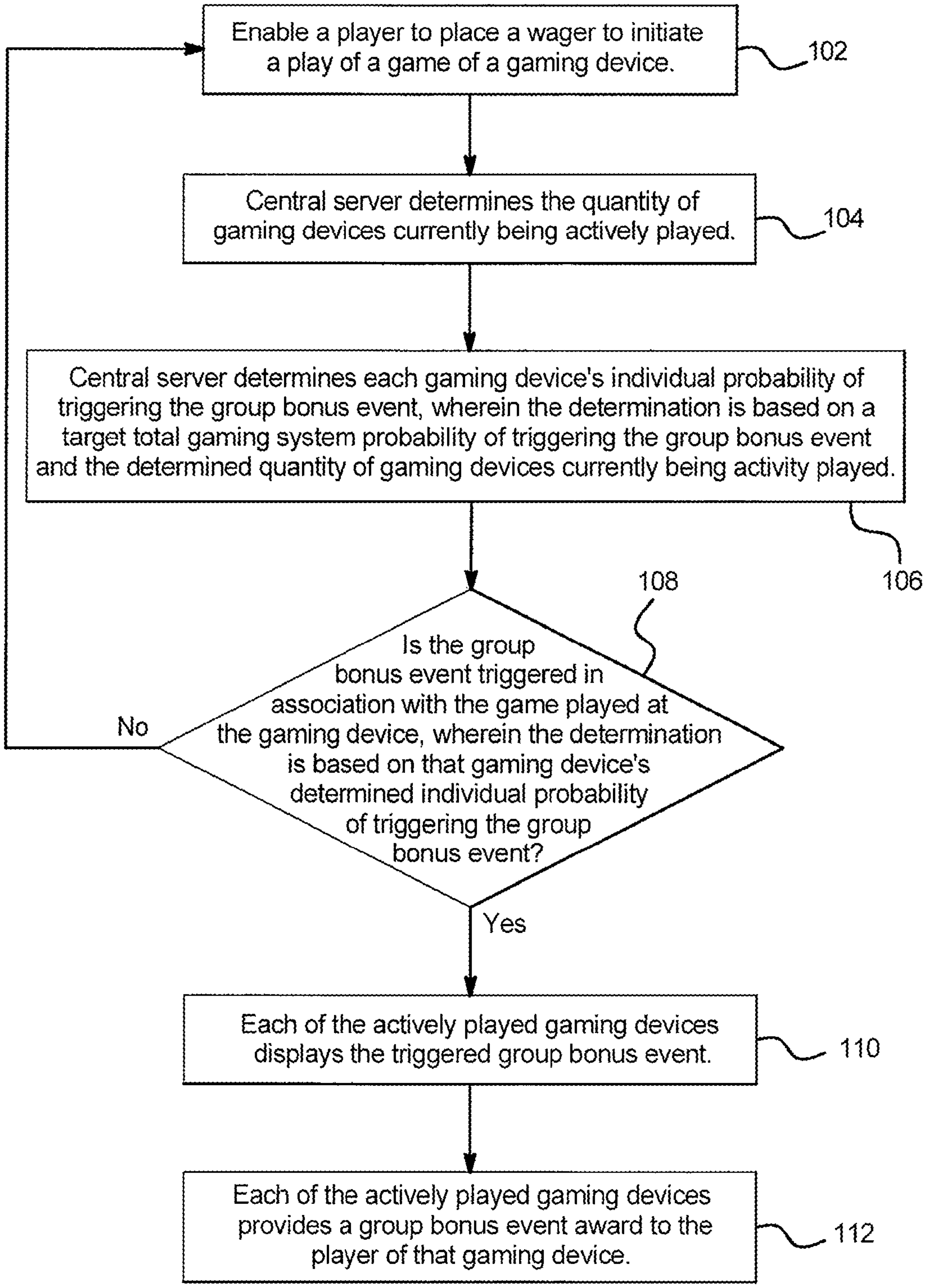
FIG. 3 is a flow-chart of one embodiment of the gaming system disclosed herein illustrating a modification of each gaming device's individual probability of triggering the group bonus event based on the quantity of player's currently actively playing the gaming devices in the gaming system.

Referring to FIG. 3, in one embodiment, the gaming system enables a player to place a wager to initiate a play of a game of a gaming device as indicated by block 102. In this embodiment, each play of a game at a gaming device in the gaming system includes a determination of whether to trigger a group bonus event for the players that are currently actively playing the gaming devices in the gaming system.

After the player's wager, the central server determines the quantity of gaming devices currently being actively played as indicated in block 104. In one embodiment, when determining the quantity of gaming devices (to determine each gaming device's individual probability of triggering the group bonus event), the gaming system counts each gaming device that is actively being played and does not count each gaming device that is not actively being played. In one such embodiment, if the player currently playing a gaming device has accumulated at least a designated number of evaluation points (as described below), that gaming device is determined to be actively played and is counted in the determined quantity of gaming devices. In this embodiment, if the player currently playing a gaming device has not accumulated at least a designated number of evaluation points, that gaming device is determined to not be actively played and is not counted in the determined quantity of gaming devices. For example, if the designated number of evaluation points necessary to be counted as being active is one, then at a first point in time for a first evaluation of whether a group bonus event is triggered, each gaming device being played by a player with at least one accumulated evaluation point is considered active and counted in the determined quantity of gaming devices.

After determining the quantity of gaming devices being actively played, as indicated in block 106 of FIG. 3, the central server determines each gaming device's individual probability of triggering the group bonus event, wherein the determination for each gaming device is based on a target total gaming system probability of triggering the group bonus event and the determined quantity of gaming devices currently being actively played. In this embodiment, a triggering of the group bonus event for any of the players at any of the gaming devices in the gaming system causes a triggering of the group bonus event for each of the actively played gaming devices in the gaming system, and thus the central server adjusts or modifies each gaming device's individual probability of triggering the group bonus event to account for different numbers of players actively playing the gaming devices in the gaming system at different points in time. It should be appreciated that in one embodiment, the total or overall gaming system probability of triggering the group bonus event at each point in time is the sum of each of the gaming device individual probabilities of triggering the group bonus event at such points in time.

In one embodiment, each gaming device's individual probability of triggering the group bonus event is inversely proportional to the total number of players actively playing the gaming devices in the gaming system. That is, a lower number of players currently actively playing the gaming devices in the gaming system at a given time equates to each individual actively played gaming device of the gaming system having a greater probability that said currently actively played gaming device will cause a triggering of a group bonus event which will apply to each of the players actively playing one of the gaming devices. In other words, a first player's individual probability of triggering a group bonus event at a given point in time is directly proportional to a quantity of players that are actively playing the gaming devices in the gaming system at that given point in time.

Figure 4:
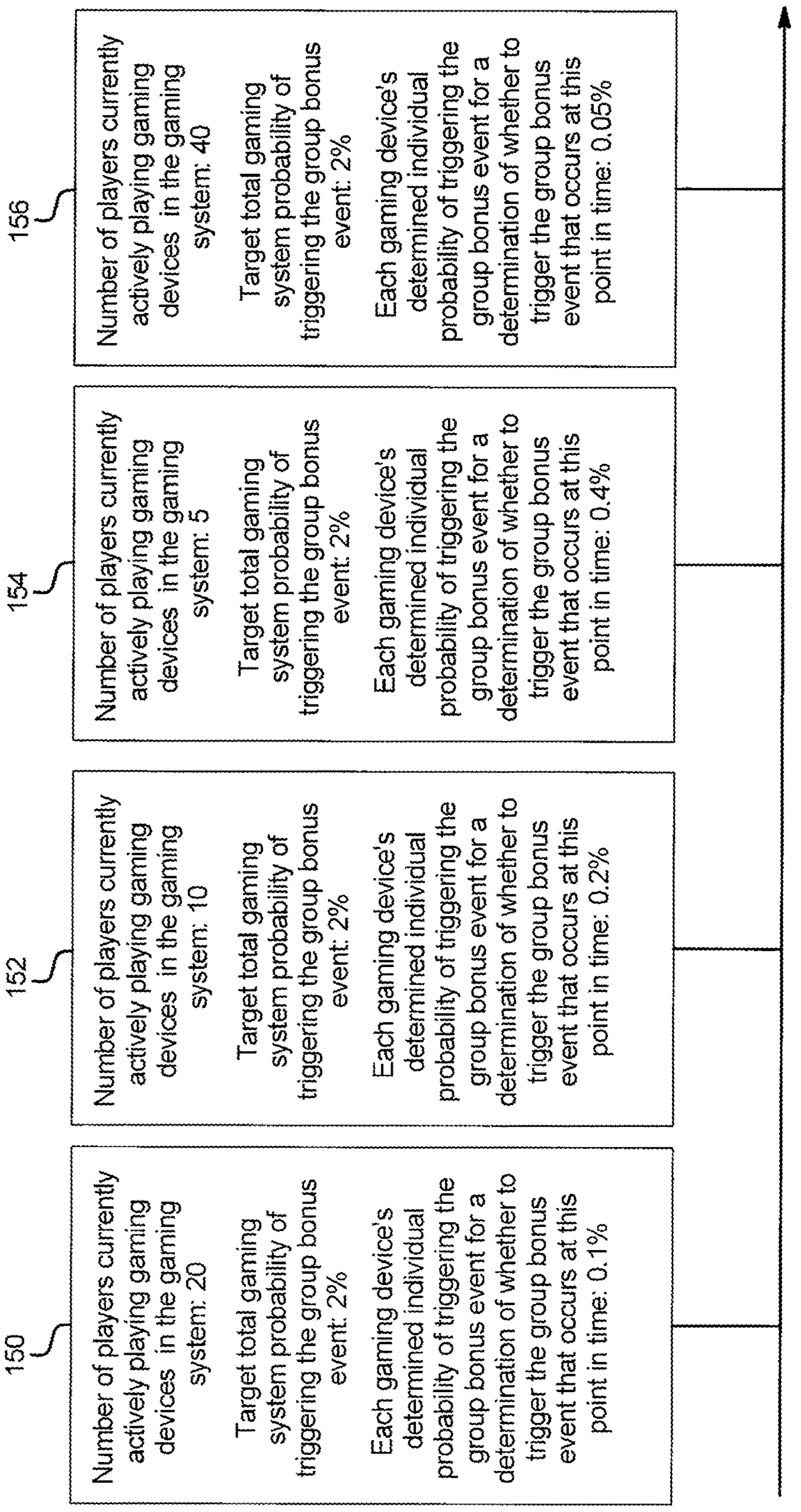
FIG. 4 is a timeline illustrating the changes in each gaming device's individual probability of triggering the group bonus event at different points in time.

For example, as seen in FIG. 4, at a first point in time 150, twenty players are currently actively playing the gaming devices in the gaming system. If the central server utilizes a target total gaming system probability of triggering the group bonus event of 2%, the central server determines that, for any determination of whether to trigger the group bonus event at this first point in time, each of the twenty actively played gaming devices will have 0.1% individual probability of triggering the group bonus event (which will apply to each of the players actively playing one of the gaming devices). That is, as each player individually has a 0.1% or 1/1000 chance of triggering the group bonus event for a game played at this first point in time, the twenty players collectively have a 20/1000 chance or 2% total gaming system probability of triggering the group bonus event for the twenty total games played at the first point in time.

As further seen in FIG. 4, at a second point in time 152, ten players are now actively playing the gaming devices in the gaming system. If the central server utilizes the target total gaming system probability of triggering the group bonus event of 2%, the central server determines that, for any determination of whether to trigger the group bonus event at this second point in time, each of the ten actively played gaming devices will have 0.2% individual probability of triggering the group bonus event which will apply to each of the players actively playing one of the gaming devices. That is, as each player individually has a 0.2% or 1/500 chance of triggering the group bonus event for a game played at this second point in time, the ten players collectively have a 10/500 chance or 2% total gaming system probability of triggering the group bonus event for the ten total games played at the second point in time.

As further seen in FIG. 4, at a third point in time 154, five players are now actively playing the gaming devices in the gaming system. If the central server utilizes the target total gaming system probability of triggering the group bonus event of 2%, the central server determines that, for any determination of whether to trigger the group bonus event at this third point in time, each of the five actively played gaming devices will have 0.4% individual probability of triggering the group bonus event which will apply to each of the players actively playing one of the gaming devices. That is, as each player individually has a 0.4% or 1/250 chance of triggering the group bonus event for a game played at this third point in time, the five players collectively have a 5/250 chance or 2% total gaming system probability of triggering the group bonus event for the five total games played at the third point in time.

As further seen in FIG. 4, at a fourth point in time 156, forty players are now actively playing the gaming devices in the gaming system. If the central server utilizes the target total gaming system probability of triggering the group bonus event of 2%, the central server determines that, for any determination of whether to trigger the group bonus event at this fourth point in time, each of the forty actively played gaming devices will have 0.05% individual probability of triggering the group bonus event which will apply to each of the players actively playing one of the gaming devices. That is, as each player individually has a 0.05% or 1/2000 chance of triggering the group bonus event for a game played at this fourth point in time, the forty players collectively have a 40/2000 chance or 2% total gaming system probability of triggering the group bonus event for the forty total games played at the forty point in time.

It should be appreciated that in one embodiment, the target total gaming system probability of triggering a group bonus event represents the probability that a group bonus event will be triggered within a total quantity of games played (or a total quantity of determinations of whether or not to trigger the group bonus event), wherein the total quantity of games played (or the total quantity of determinations of whether or not to trigger the group bonus event) is equal to the quantity of players actively playing the gaming devices in the gaming system. For example, if three players are currently actively playing three gaming devices in the gaming system at a first point in time, the probability that a group bonus event will be triggered within three games played (i.e., within three determinations of whether or not to trigger the group bonus event) is equal to the probability of a group bonus event being triggered within four games played (i.e., within four determinations of whether or not to trigger the group bonus event) if four players are currently actively playing four gaming devices in the gaming system at a second point in time. In one embodiment, the target total gaming system probability of triggering the group bonus event is a constant or substantially constant probability that a number of games played or group bonus event triggering determinations (equal to the number of players currently actively playing the gaming devices in the gaming system) will yield a group bonus event triggering outcome. In one such embodiment, the gaming system adjusts each individual gaming device's probability of triggering the group bonus event to provide that the gaming system's total probability per game play round (i.e., a quantity of games played equal to the number of players currently actively playing the gaming devices in the gaming system) remains the same or substantially the same regardless of the number of players actively playing the gaming devices.

After determining each gaming device's individual probability of triggering the group bonus event, the gaming system determines if the group bonus event is triggered in association with the game played at the gaming device, wherein the determination is based on that gaming device's determined individual probability of triggering the group bonus event as indicated in diamond 108 of FIG. 3. In different embodiments, the determination of if the group bonus event is triggered occurs in association with: (a) a play of a primary game at the gaming device, (b) a play of a secondary game at the gaming device, and/or (c) one or more occurrences at the gaming device which are independent of any primary or secondary games played.

In one embodiment, as described above, each game played at a gaming device in the gaming system includes a determination of whether to trigger a group bonus event for a plurality of or each of the player's that are currently actively playing one of the gaming devices in the gaming system. In one such embodiment, the determination of if a group bonus event is triggered is based on the generation and display of one or more symbols in a primary game. That is, in this embodiment, the triggering of the group bonus event is based on a symbol-driven event.

In one embodiment, the gaming system employs one or more group bonus event triggering symbols, such as sub-symbols, secondary symbols or overlay symbols, in the determination of whether to trigger a group bonus event. In one such embodiment, based on the quantity of players at the gaming devices in the gaming system, the gaming system adjusts or modifies each gaming device's individual probability of triggering the group bonus event by modifying the probability that a play of the primary game of that gaming device will generate the group bonus event triggering symbols necessary to trigger the group bonus event. It should be appreciated that by utilizing group bonus event triggering symbols which are separate from the primary game symbols, the gaming system disclosed herein is configured to change each gaming device's individual probability of triggering the group bonus event without changing such primary game symbols or otherwise affecting the paytable of the primary game. Accordingly, by modifying the probabilities of generating the group bonus event triggering symbols necessary to trigger the group bonus event, the gaming system disclosed herein provides a symbol-driven group bonus event which accounts for different quantities of players actively playing the gaming devices in the gaming system.

In one such embodiment, the gaming system modifies each gaming device's individual probability of triggering the group bonus event by modifying the quantity of group bonus event triggering symbols available to be generated for a play of a primary game. For example, if additional players begin actively playing the gaming devices in the gaming system at a first point in time, the central server removes one or more group bonus event triggering symbols from the available symbols which may be generated for any plays of the games at such gaming devices at this point in time. In this example, by removing one or more group bonus event triggering symbols, the central server is reducing the probability that such group bonus event triggering symbols will be generated and thus the central server is reducing each gaming device's individual probability of triggering the group bonus event (to reach the target total gaming system probability of triggering the group bonus event).

In another such embodiment, the gaming system modifies each gaming device's individual probability of triggering the group bonus event by modifying the probability that that gaming device generates one or more group bonus event triggering symbols for a play of a primary game. For example, if one or more players stop actively playing the gaming devices in the gaming system at a second point in time, the central server increases the probability of one or more group bonus event triggering symbols being generated for any plays of the games at the remaining actively played gaming devices at this point in time. In this example, by increasing the probability that one or more group bonus event triggering symbols will be generated, the central server is increasing each remaining actively played gaming device's individual probability of triggering the group bonus event (to reach the target total gaming system probability of triggering the group bonus event).

Utilizing the timeline described above with respect to FIG. 4, in one example, if twenty players are currently actively playing the gaming devices in the gaming system at the first point in time 150, to reach a constant or substantially constant target total gaming system probability of triggering the group bonus event of 2%, the central server determines that each play of a primary game that occurs at this point in time (i.e., each determination of whether to trigger the group bonus event) will have a 0.1% probability (or 1/1000 chance) of generating the group bonus event triggering symbols necessary to trigger the group bonus event. That is, for each gaming device actively played in the gaming system at this point in time, the central server adjusts the quantity of group bonus event triggering symbols available for that gaming device and/or adjusts the probability of generating one or more of the group bonus event triggering symbols available for that gaming device such that the group bonus event triggering symbols necessary to trigger the group bonus event will be generated, on average, once every one-thousand plays of the primary game for that gaming device.

In this example, further utilizing the timeline described above with respect to FIG. 4, if ten players are currently actively playing the gaming devices in the gaming system at the second point in time 152, to reach the constant or substantially constant target total gaming system probability of triggering the group bonus event of 2%, the central server determines that each play of a primary game that occurs at this point in time (i.e., each determination of whether to trigger the group bonus event) will have a 0.2% probability (or 1/500 chance) of generating the group bonus event triggering symbols necessary to trigger the group bonus event. That is, for each gaming device actively played in the gaming system at this point in time, the central server adjusts the quantity of group bonus event triggering symbols available for that gaming device and/or adjusts the probability of generating one or more of the group bonus event triggering symbols available for that gaming device such that the group bonus event triggering symbols necessary to trigger the group bonus event will be generated, on average, once every five-hundred plays of the primary game for that gaming device.

It should be appreciated that in this example, since the generation of the combination of group bonus event triggering symbols for any player causes a triggering of the group bonus event for each of the players actively playing a gaming device in the gaming system, the different individual odds of generating the combination of group bonus event triggering symbols at different points in time is accounted for by the different number of plays of the primary games by the different number of players. Thus, in this example, by adjusting the odds of generating the combination of group bonus event triggering symbols, the target total gaming system probability of triggering the group bonus event is reached at the first point in time when twenty players are currently actively playing the gaming devices in the gaming system (i.e., 20/1000 or 1/50) and is also reached at the second point in time when ten players are currently actively playing the gaming devices in the gaming system (i.e., 10/500 or 1/50).

Figure 5:
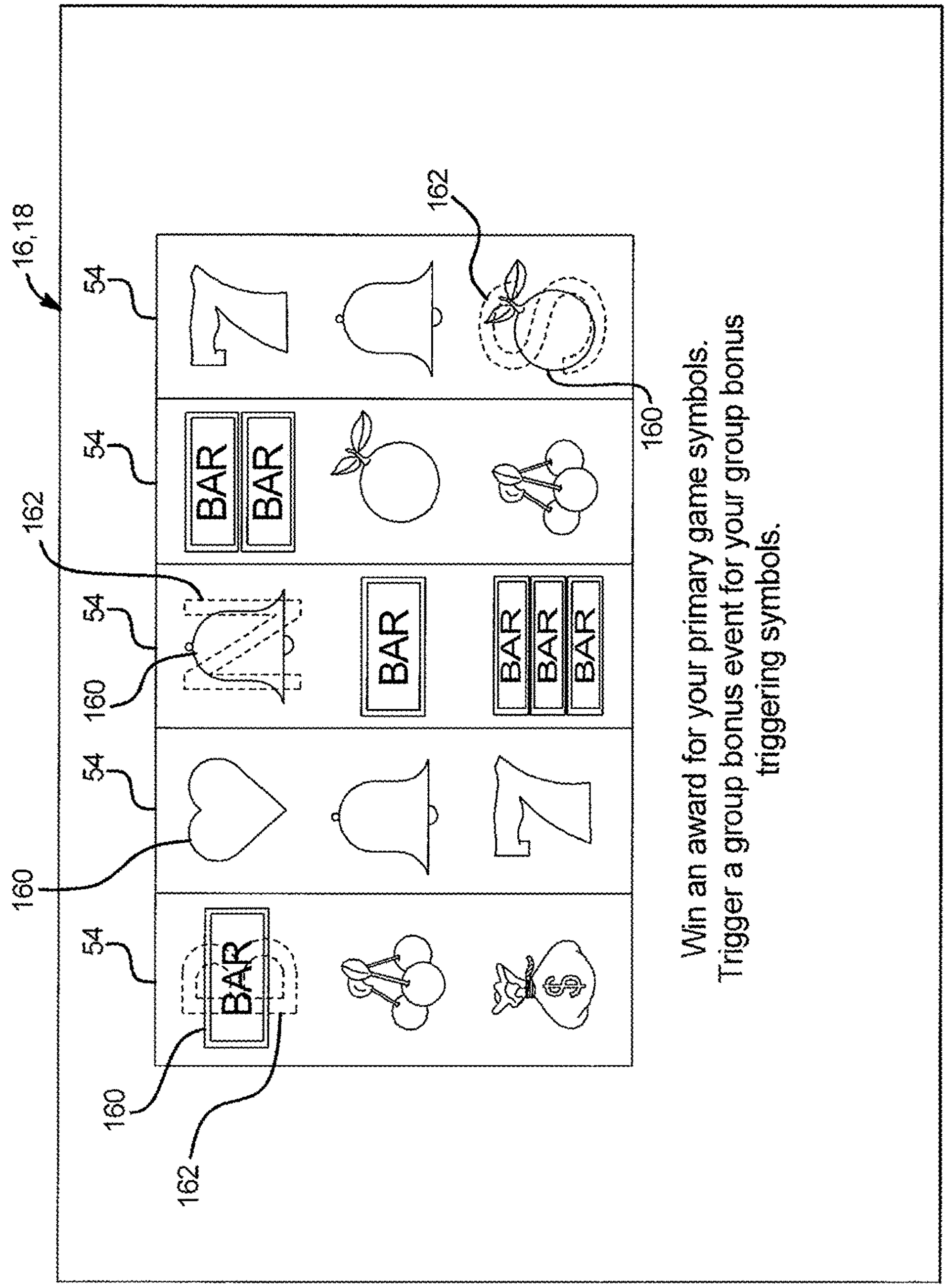
FIG. 5 is a top plan view of one embodiment of the gaming system disclosed herein illustrating a generation of a plurality of primary game symbols and a plurality of group bonus event triggering overlay symbols.

As seen in FIG. 5, after adjusting the quantity of group bonus event triggering symbols available to generate (based on the quantity of gaming devices being actively played), the gaming device has generated a plurality of primary game symbols 160 and a plurality of group bonus event triggering overlay symbols 162. As seen in FIG. 5, such group bonus event triggering overlay symbols are separate from the primary game symbols and may be displayed in the same symbol position as such primary game symbols. In one such example embodiment, the gaming device displays appropriate messages such as "WIN AN AWARD FOR YOUR PRIMARY GAME SYMBOLS" and "TRIGGER A GROUP BONUS EVENT FOR YOUR GROUP BONUS EVENT TRIGGERING SYMBOLS" to the player visually, or through suitable audio or audiovisual displays. As described above, the use of such group bonus event triggering symbols provides a symbol-driven group bonus event which attempts to equitably factor in different quantities of players actively playing the gaming devices in the gaming system at different points in time.

In one embodiment, as described above, the quantity of players currently actively playing the gaming devices in the gaming system is monitored by the central server. That is, the central server or controller continuously or substantially continuously maintains or keeps track of the quantity of gaming devices currently being actively played. In one such embodiment, before each game is played at a gaming device, the gaming device requests information or data regarding a quantity of group bonus event triggering symbols to utilize for the upcoming game. In this embodiment, the central server determines, based on the quantity of gaming devices currently being actively played, a quantity of group bonus event triggering symbols to utilize and the central server communicates the determined information or data to the gaming device. In another such embodiment, at designated intervals, such as every few seconds, the central server determines, based on the quantity of gaming devices currently being actively played, a quantity of group bonus event triggering symbols to utilize for any upcoming games. In this embodiment, at such designated intervals, the central server communicates the determined information or data to each of the gaming devices in the gaming system. In another embodiment, each gaming device in the gaming system is continuously or substantially continuously aware of which gaming devices in the gaming system are currently being actively played. In this embodiment, based on such peer-to-peer recognition by the gaming devices, before each game is played at a gaming device, that gaming device determines, based on the quantity of gaming devices currently being actively played, a quantity of group bonus event triggering symbols to utilize for the upcoming game.

In one embodiment, the gaming system utilizes real-time information or data regarding the quantity of gaming devices currently being actively played. In another embodiment, a lag or delay may occur between the quantity of actively played gaming devices used for individual gaming device probability determinations and the quantity of gaming devices currently being actively played. In this embodiment, since the actual quantity of gaming devices being actively played at a given point in time may be different than the utilized quantity of active gaming devices for gaming device individual probability determination purposes, the target total gaming system probability may not be reached. Accordingly, in certain embodiments, the gaming system disclosed herein attempts to cause the gaming system's total gaming system probability of triggering a group bonus event to reach a designated range of target total gaming system probabilities of triggering the group bonus event.

In one embodiment, as described above, each game played at a gaming device in the gaming system includes a determination of whether to trigger a group bonus event for a plurality of or each of the player's that are currently actively playing one of the gaming devices in the gaming system. In one such embodiment, the determination of if a group bonus event is triggered for a plurality of or each of the player's that are currently actively playing one of the gaming devices in the gaming system is based on an outcome of a group bonus event participation sequence or group sub-bonus event. In this embodiment, if the player participating in the group bonus event participation sequence is successful in the group bonus event participation sequence, the central server triggers the group bonus event and the players currently actively playing the gaming devices in the gaming system participate in the group bonus event. On the other hand, if the player participating in the group bonus event participation sequence is unsuccessful in the group bonus event participation sequence, the central server does not trigger the group bonus event and none of the players at none of the gaming devices in the gaming system participate in the group bonus event.

In one embodiment, the probability of triggering the group bonus event participating sequence is independent of the quantity of players currently playing the gaming devices in the gaming system. In this embodiment, once the group bonus event participation sequence is triggered, the probability of generating a successful outcome in the group bonus event participation sequence (and thus triggering the group bonus event) is dependent or otherwise based on the quantity of players currently actively playing the gaming devices in the gaming system. That is, the triggering of the group bonus event is based on a first, constant probability of triggering the group bonus event participation sequence and a second, variable probability of successfully triggering the group bonus event based on the outcome of the group bonus event participation sequence. In such an embodiment, as any gaming device in the gaming system can trigger the group bonus event participation sequence, the greater the quantity of players at the gaming devices in the gaming system, the greater the frequency that the group bonus event participation sequence is triggered. Accordingly, to maintain that the target total gaming system probability of triggering the group bonus event is reached (and remains constant or substantially constant) regardless of the number of players currently playing the gaming devices in the gaming system, the central server adjusts or modifies the probability of the group bonus event participation sequence causing a triggering of the group bonus event depending on the number of players currently playing the gaming devices in the gaming system.

For example, if one of the gaming devices triggers the group bonus event participation sequence, on average, once every twenty plays of the primary game, a first player is playing a first gaming device in the gaming system at a first point in time and the central server triggers the group bonus event participation sequence at this first point in time, the central server provides that the first gaming device would have a one-in-five chance of success in the group bonus event participation sequence. In this example, if a second player begins playing a second gaming device in the gaming system at a second point in time (and the second player plays at substantially the same rate as the first player) and the central server triggers the group bonus event participation sequence for either the first player or the second player, the central server provides that the triggering gaming device would have a one-in-ten chance of success in the group bonus event participation sequence. It should be appreciated that in this example, since a successful outcome in the group bonus event participation sequence causes a triggering of the group bonus event for both the first player and the second player, the modification of the odds of success in the group bonus event participation sequence maintains that the target total gaming system probability of triggering the group bonus event is reached (or substantially reached) regardless of the quantity of players at the gaming devices in the gaming system. That is, in this example, if only the first player is playing at a gaming device in the gaming system, the gaming system's total probability of triggering the group bonus event is $1/100$ (i.e., ($1/20$ plays of the primary game triggers the group bonus event participation sequence)×($1/5$ chance of success in the group bonus event participation sequence)) and if the first and second players are both at gaming devices in the gaming system, the gaming system's total probability of triggering the group bonus event is $\frac{2}{200}$ or $\frac{1}{100}$ (i.e., ($\frac{2}{20}$ plays of the primary game triggers the group bonus event participation sequence)×($\frac{1}{10}$ chance of success in the group bonus event participation sequence)).

It should be appreciated that after determining the player's chance of success in the group bonus event participation sequence, any suitable manner of displaying the group bonus event participating sequence (which accounts for different numbers of players currently actively playing the gaming devices) may be incorporated in the gaming system disclosed herein. In different embodiments, the group bonus event participation sequence may incorporate any of the types of games described herein, as well as any suitable puzzle-type game, any suitable persistence game, any suitable wheel game, any suitable selection game, any suitable offer and acceptance game, any suitable cascading symbols game, any suitable ways to win game, any suitable scatter pay game, any suitable group game or any other suitable type of game.

Figure 6:
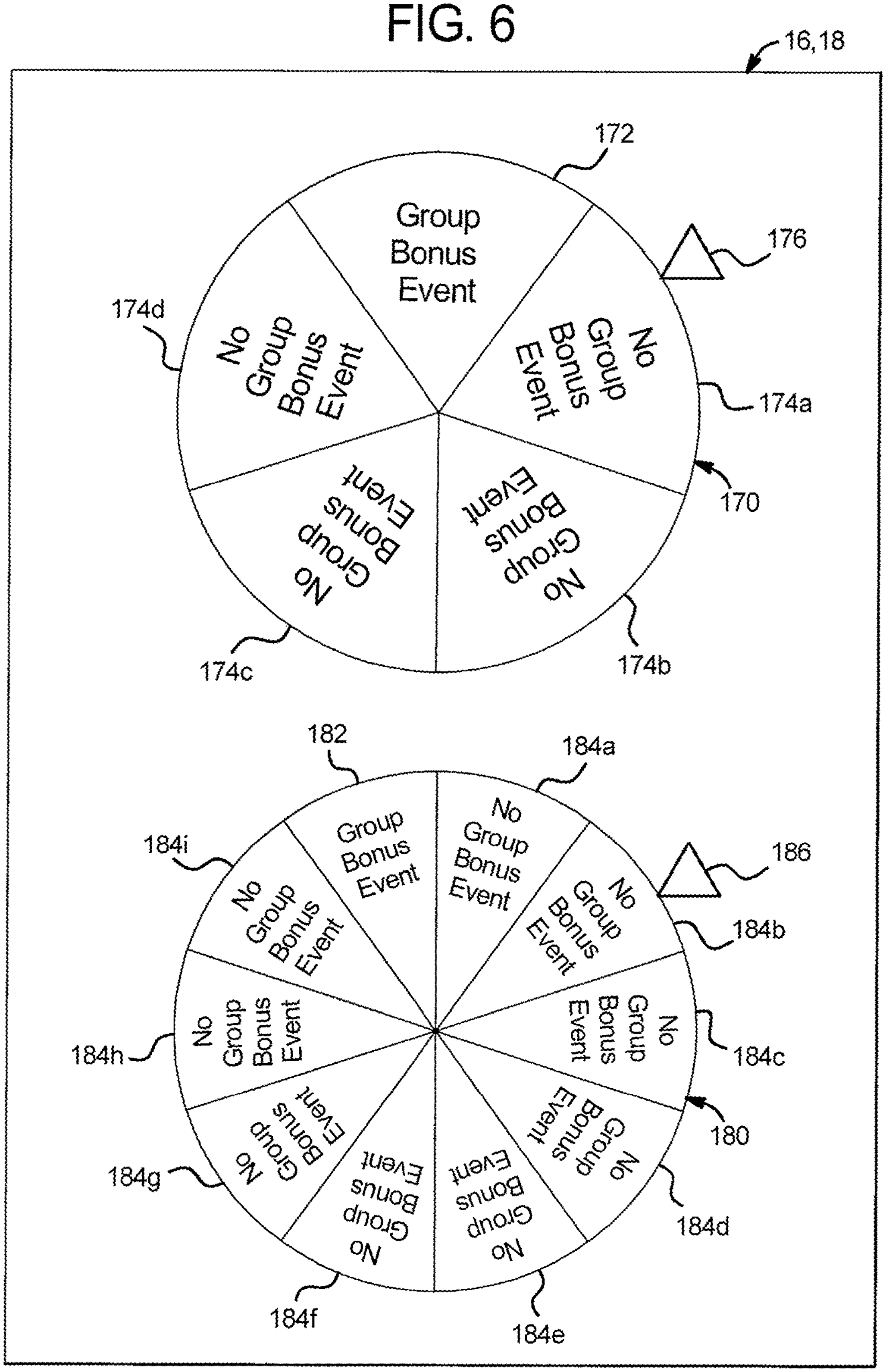
FIG. 6 is a top plan view of one embodiment of the gaming system disclosed herein illustrating a plurality of symbol generators which may be employed during a group bonus event participation sequence.

For example, as seen in FIG. 6, if at a first point time, the gaming system determines that the player has a one-in-five chance of success in the group bonus event participation sequence, the gaming system employs a first symbol generator, such as the first wheel 170 with one successful outcome segment 172, four unsuccessful outcome segments 174*a* to 174*d* and an indicator 176, to determine the player's outcome in the group bonus event participation sequence. In this example, if at a different point in time, the gaming system determines that the player has a one-in-ten chance of success in the group bonus event participation sequence, the gaming system employs a second, different symbol generator, such as the second wheel 180 with one successful outcome segment 182, nine unsuccessful outcome segments 184*a* to 184*i* and an indicator 186, to determine the player's outcome in the group bonus event participation sequence.

In one embodiment, as described above, the quantity of players currently actively playing the gaming devices in the gaming system is monitored by the central server. That is, the central server or controller continuously or substantially continuously maintains or keeps track of the quantity of gaming devices currently being actively played. In one such embodiment, before each group bonus event participation sequence is played at a gaming device, the gaming device requests information or data regarding which features to incorporate into the upcoming group bonus event participation sequence (i.e., which symbol generator to utilize). In this embodiment, the central server determines, based on the quantity of gaming devices currently being actively played, which features to incorporate into the upcoming group bonus event participation sequence and the central server communicates the determined information or data to the gaming device. In another such embodiment, at designated intervals, such as every few seconds, the central server determines, based on the quantity of gaming devices currently being actively played, which features to incorporate into any group bonus event participation sequence. In this embodiment, at such designated intervals, the central server communicates the determined information or data to each of the gaming devices in the gaming system. In another embodiment, each gaming device in the gaming system is continuously or substantially continuously aware of which gaming devices in the gaming system are currently being actively played. In this embodiment, based on such peer-to-peer recognition by the gaming devices, before each group bonus event participation sequence is played at a gaming device, that gaming device determines, based on the quantity of gaming devices currently being actively played, which features to utilize for the upcoming group bonus event participation sequence.

It should be appreciated that in certain embodiments, the gaming system does not directly perform the step of determining each gaming device's individual probability of triggering the group bonus event based on the quantity of gaming devices in the gaming system currently being actively played. Rather, in these embodiments, the gaming system utilizes the quantity of gaming devices in the gaming system currently being actively played and the target total gaming system probability of triggering the group bonus event to determine whether or not to trigger the group bonus event. For example, in the embodiment described above in which the gaming system employs one or more group bonus event triggering symbols, based on the quantity of gaming devices currently being actively played, the gaming system adds or removes one or more group bonus event triggering symbols from the pool of symbols which may be generated for a given symbol generation. In this example, although the gaming system did not modify each of the gaming device's individual probability of triggering the group bonus event, adding or removing one or more group bonus event triggering symbols has the effect of increasing or decreasing the gaming device's individual probability of triggering the group bonus event.

Referring back to FIG. 3, if the determination is that the group bonus event is not triggered, the gaming system returns to block 102 and awaits a player to place another designated wager to initiate a play of a gaming device in the gaming system. For example, if the triggering of the group bonus event is the generation of a combination of group bonus event triggering symbols in a primary game (as described above) and the play of the primary game did not result in the generation of the combination of group bonus event triggering symbols, the group bonus event is not triggered. It should be appreciated that, in one embodiment, even though no group bonus event was triggered in association with the play of the game, the gaming system still provides one or more primary game awards and one or more secondary game awards in association with the play of the game as described above.

If the determination is that the group bonus event is triggered, as indicated in block 110 of FIG. 3, each of the actively played gaming devices displays the triggered group bonus event. After triggering the group bonus event, each of the actively played gaming devices provides a group bonus event award to the player of that gaming device as indicated in block 112 of FIG. 3. In one such embodiment, the group bonus event includes at least one group bonus event determination to determine and provide one or more group bonus event awards.

In one embodiment, a plurality of players at a plurality of linked gaming devices work in conjunction with one another, such as by playing together as a team or group, to win one or more group bonus event awards in the triggered group bonus event. In one such embodiment, any group bonus event award won by the group is shared, either equally or based on any suitable criteria, amongst the different players of the group. In another embodiment, a plurality of players at a plurality of linked gaming devices compete against one another for one or more group bonus event awards in the triggered group bonus event. In one such embodiment, a plurality of players at a plurality of linked gaming devices participate in a gaming tournament for one or more group bonus event awards. In another embodiment, a plurality of players at a plurality of linked gaming devices play for one or more group bonus event awards wherein an outcome generated by one gaming device affects the outcomes generated by one or more linked gaming devices. It should be appreciated that in different embodiments, the group bonus event award provided to one or more players for the triggered group bonus event is predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on the player's primary game wager, determined based on time (such as the time of day), determined based on an amount of coin-in accumulated in one or more pools or determined based on any other suitable method or criteria.

In one embodiment, the gaming system includes a group or community display device controlled by the central server. Such a community display is configured to display part or all of any triggered group bonus event. In one such embodiment, the triggered group bonus event includes a plurality of free games or free spins of a plurality of group or community reels displayed by the community display. In this embodiment, each community reel includes a plurality of community symbols which are generated for each of the players participating in the triggered group bonus event.

It should thus be appreciated that in one embodiment, the gaming system disclosed herein includes a plurality of gaming devices, and at least one controller configured to communicate with each of the gaming devices. Upon a communication of a wager event at a first one of the gaming devices, the at least one controller is programmed to: determine a quantity of the gaming devices which have communicated a wager event within a predefined period of time, determine a gaming device probability of triggering a group bonus event, wherein the determination is based on the determined quantity of the gaming devices which have communicated a wager event within the predefined period of time and a target gaming system probability of triggering the group bonus event, and determine if the first one of the gaming devices has caused, based on the determined gaming device probability, the group bonus event to trigger. If the first one of the gaming devices is determined to cause the group bonus event to trigger, for each of the determined quantity of the gaming devices which have communicated a wager event within the predefined period of time, cause: (i) the gaming device to display an indication of the gaming device's participation in the group bonus event, (ii) the gaming device to display a group bonus event award to be provided by the gaming device, and (iii) the gaming device to provide the displayed group bonus event award.

It should further be appreciated that in one embodiment, the gaming system disclosed herein includes a plurality of gaming devices. Each gaming device includes at least one gaming device processor, at least one input device, at least one display device, and at least one memory device which stores a plurality of instructions, which when executed by the at least one gaming device processor, cause the at least one gaming device processor to operate with the at least one input device and the at least one display device to receive from a player at least one input in association with a play of a game. The gaming system includes at least one controller configured to communicate with each of the gaming devices and programmed to: at a first point in time: for each play of the game of each of the gaming devices, determine whether to trigger the group bonus event, wherein said determination is based on a constant gaming system probability of triggering the group bonus event and a first quantity of said gaming devices being actively played at the first point in time, and if the determination is to trigger the group bonus event, cause each of the gaming devices being actively played at the first point in time to display the group bonus event. At a second, different point in time, the at least one controller is programmed to: for each play of the game of each of the gaming devices, determine whether to trigger the group bonus event, wherein said determination is based on the constant gaming system probability of triggering the group bonus event and a second, different quantity of said gaming devices being actively played at the second point in time, and if the determination is to trigger the group bonus event, cause each of the gaming devices being actively played at the second point in time to display the group bonus event.

In one embodiment (not shown), there are a plurality of tiers or stages in the triggered group bonus event, wherein each tier includes a plurality of free spins of the community reels. For example, the triggered group bonus event includes five tiers, wherein each tier includes five free spins of the community reels. In one embodiment, each tier is associated with a progressive award. In this embodiment, for each free spin of a given tier, the community reels generate and display a plurality of community symbols and any award associated with the generated community symbols is provided (or is modified by the player's applicable group bonus event multiplier and then provided) to each of the players participating in the triggered group bonus event.

In one embodiment, each player of the triggered group bonus event is also assigned a sub-symbol. Each sub-symbol that is generated (and displayed as an over-lay on a displayed community symbol) is accumulated for the player assigned to that generated sub-symbol. In this embodiment, if a designated number of generated sub-symbols are accumulated for a player, that player completes the current tier or stage of the triggered group bonus event and moves on to the next tier, if any, of the triggered group bonus event. By eliminating any player's that did not accumulate the designated number of generated sub-symbols for each tier, the gaming system disclosed herein provides that as the triggered group bonus event plays out, fewer and fewer players will remain competing for the progressive awards associated with any future tiers.

Moreover, in one such embodiment, the first player to complete the current tier (i.e., the first player to accumulate the designated number of sub-symbols) is provided the progressive award associated with that tier. In this embodiment, each new tier resets each player's accumulated sub-symbols such that with each new tier, each player still participating in the triggered group bonus event begins with a chance of winning the progressive award associated with that tier.

It should be appreciated that any suitable manner of providing the group bonus event to each of the players at each of the gaming devices actively played when the determination to trigger the group bonus event occurred may be incorporated in the gaming system disclosed herein. That is, any suitable primary game or secondary game may be utilized as the triggered group bonus event to provide the players of the actively played gaming devices of the gaming system with a group bonus event award. In different embodiments, the triggered group bonus event may incorporate any of the types of games described herein, as well as any suitable puzzle-type game, any suitable persistence game, any suitable wheel game, any suitable selection game, any suitable offer and acceptance game, any suitable cascading symbols game, any suitable ways to win game, any suitable scatter pay game, any suitable group game or any other suitable type of game.

In different embodiments, the type of group bonus event displayed to one or more of the players at the actively played gaming devices and/or the features incorporated into such triggered group bonus events is predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on the player's primary game wager, determined based on time (such as the time of day), determined based on an amount of coin-in accumulated in one or more pools or determined based on any other suitable method or criteria.

In one embodiment, as described above, when determining the quantity of gaming devices being played (to determine each gaming device's individual probability of triggering the group bonus event), the gaming system counts each gaming device that is actively being played and does not count each gaming device that is not actively being played. In one such embodiment, the central server determines if a gaming device is being actively played based on the status of such gaming device as either enrolled or inactive status or active status. In one such embodiment, the enrolled or inactive status means that the gaming device is one of the linked gaming devices in the system, but is not being actively played by a player during a group bonus event qualification period. A gaming device may be classified as enrolled status for several reasons. For example, no player may be playing the gaming device. In another example, a player could be playing the gaming device (i.e., by having credits on the gaming device), but be playing too slowly or be interrupted during play. In this case, the player could have credits on the credit meter of the gaming device, but the player has not made a wager on a primary game or otherwise qualified for a group bonus event during the group bonus event qualification period.

In one such embodiment, the active status means that the gaming device is being actively played by a player during a group bonus event qualification period. In one embodiment, actively playing during a group bonus event qualification period means that the player is playing the primary game of the gaming device (i.e., placing wagers on plays of the primary game) at least at a predefined minimum rate during a predefined time period. For example, the gaming device may be in active status when a player has made at least one play of the primary game in a fifteen second period prior to the triggering of the group bonus event. In this example, the group bonus event qualification period is that fifteen second period prior to the triggering of the group bonus event.

In another embodiment, the active status is alternatively or additionally based on the amount wagered on the plays of the primary game during a group bonus event qualification period. In a further alternative embodiment, the determination of the active status is based on a designated minimum number of plays of the primary game or number of wagers on the primary game in a designated time period. The determination of active status may take into account other factors such as interruptions or displays in play of the primary game such as caused by the triggering of other bonuses or the operation of other secondary games of the gaming devices. In another embodiment, a gaming device can only be determined to be an active gaming device if an additional wager, such as a side-bet or side-wager, is made by a player at a gaming device of the gaming system for one player of a game, a plurality of plays of a game or all plays of a game in a designed period of time, such as a designed time period. It should be appreciated that a gaming device is classified as active based on any one or more suitable parameters or criteria as determined by the implementer or operator of the gaming system.

The gaming system disclosed herein contemplates other or additional methods for determining that a gaming device is active. For instance, the player may be enabled to make a side wager or additional wager to be active for one or more subsequent group bonus events. The side wager feature could also be time based where the additional wager causes the gaming device to be active for a subsequent time period, such as one minute. In another alternative embodiment, a minimum wager level is required for a gaming device to qualify to participate in the group bonus event. In one embodiment, this minimum wager level is the maximum wager level for the primary game in the gaming device. This requirement is in addition to the requirement that the gaming device be active to qualify to participate in the group bonus event participation gaming sequence. Another method for determining if the gaming device is active is whether or not the player has wagered a minimum level of monetary units since the occurrence of the last bonus event. In another embodiment, each wager (or alternatively each side wager) placed by a player is utilized by the gaming system to allocate or associate an amount of time for which the player's gaming device will be considered active. In this embodiment, if the gaming device has at least an amount of allocated time remaining when the group bonus event is triggered (i.e., the allocated amount of time has not elapsed), the gaming device is considered active. In another embodiment, each wager (or alternatively each side wager) placed by a player is utilized by the gaming system to allocate or associate a quantity of evaluations for which the player's gaming device will be considered active. In this embodiment, if the gaming device has at least one evaluation remaining when the group bonus event is triggered (i.e., the allocated quantity of evaluations have not all been used), the gaming device is considered active.

In another embodiment, active status is alternatively or additionally based on the total quantity of gaming devices in the gaming system which have accumulated at least a designated quantity of evaluation points. In another embodiment, active status is alternatively or additionally based on the total quantity of accumulated evaluation points for each of the gaming devices in the gaming system. In another embodiment, active status is alternatively or additionally based on the quantity of unique gaming machines that have played one or more games during a previous time period. In an alternative embodiment, active status is additionally based on one or more additional, non-deterministic factors, such as if a player tracking card is inserted in a gaming device and/or if a credit meter of a gaming device has a current balance greater than a designated balance.

In different embodiments, one or more additional statuses may be employed. For instance, a gaming device will be in a participating status if an individual player playing the gaming device is a premier player. In this embodiment, when a gaming device is in the participating status, the gaming system automatically treats the gaming device as an active gaming device for purposes of the other determinations including group bonus event eligibility by the gaming system. It should be appreciated that a player's participating status could be determined at least in part based on the status of that player determined via a player tracking card or other player identification device used by that player in the gaming device. It should be appreciated that other criteria can be used to determine if a player is in the participating status.

In another embodiment, the gaming system disclosed herein provides that different ranges of gaming device individual probabilities are associated with different quantities of gaming devices currently being actively played. In this embodiment, the gaming system determines the quantity of gaming devices in the gaming system currently being actively played and selects an individual probability of triggering the group bonus event for such gaming devices from a range of probabilities associated with the determined quantity of gaming devices. For example, if a first quantity of gaming devices in the gaming system are currently being actively played, the gaming system selects, from a first range of probabilities associated with the first quantity of gaming devices, a probability of triggering the group bonus event to individually associate with such gaming devices.

In one alternative embodiment, each gaming device's individual probability of triggering the group bonus event is based on the quantity of gaming devices in the gaming system currently being actively played and one or more additional factors or criteria associated with: (i) one or more plays of one or more primary games at one or more of the gaming devices, (ii) one or more plays of one or more secondary games at one or more of the gaming devices, and/or (iii) one or more occurrences at one or more of the gaming devices which are independent of any primary or secondary games played. In different embodiments, such additional factors or criteria are predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on the player's primary game wager, determined based on time (such as the time of day), determined based on an amount of coin-in accumulated in one or more pools or determined based on any other suitable method or criteria.

In one alternative embodiment, each gaming device's individual probability of triggering the group bonus event is based on the quantity of gaming devices in the gaming system actively played within a designated time period before the determination of whether to trigger the group bonus event. In this embodiment, rather than utilizing the quantity of gaming devices actively played at the point in time when the determination of whether to trigger the group bonus event occurs, in determining each gaming device's individual probability of triggering the group bonus event, the gaming system utilizes the quantity of gaming devices actively played for a designated time period before the determination of whether to trigger the group bonus event occurs. For example, if the gaming system of this embodiment determines that for the thirty-seconds before the determination of whether to trigger the group bonus event occurs, the gaming system averaged six actively played gaming device per second, then even if only three gaming devices are currently actively played at the point in time when the determination of whether to trigger the group bonus event occurs, the gaming system utilizes the quantity of six actively played gaming devices in determining each of the three currently active gaming device's individual probabilities of triggering the group bonus event. In different embodiments, the period of time the gaming system utilizes to determine the quantity of actively played gaming devices is predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on the player's primary game wager, determined based on time (such as the time of day), determined based on an amount of coin-in accumulated in one or more pools or determined based on any other suitable method or criteria.

In another alternative embodiment, the determination of whether to trigger the group bonus event is based on a gaming device's individual probability of triggering the group bonus event and one or more additional factors or criteria associated with: (i) one or more plays of one or more primary games at one or more of the gaming devices, (ii) one or more plays of one or more secondary games at one or more of the gaming devices, and/or (iii) one or more occurrences at one or more of the gaming devices which are independent of any primary or secondary games played. In different embodiments, such additional factors or criteria are predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on the player's primary game wager, determined based on time (such as the time of day), determined based on an amount of coin-in accumulated in one or more pools or determined based on any other suitable method or criteria.

In another embodiment, the gaming system disclosed herein modifies one or more gaming device's individual probability of triggering the group bonus event based on the quantity of gaming devices in the gaming system currently being actively played, wherein different players have different individual probabilities of triggering the group bonus event. In this embodiment, the gaming system attempts to maintain or reach the target total gaming system probability of triggering the group bonus event (for each of the actively played gaming devices in the gaming system) and provides that different players have different individual probabilities of triggering the group bonus event (which are based, at least in part, on the quantity of gaming devices in the gaming system currently being actively played).

In another embodiment, in determining whether or not to trigger the group bonus event award, the gaming system disclosed herein utilizes group bonus event triggering symbols and a group bonus event participation sequence. In this embodiment, based on the quantity of gaming devices currently being actively played, the gaming system adjusts the quantity of group bonus event triggering symbols which may be generated for a play of a primary game. In this embodiment, if a designated combination of group bonus event triggering symbols is generated, the gaming system proceeds to a group bonus event participation sequence, wherein the probability of success in the group bonus event participation sequence is also based on the quantity of gaming devices currently being actively played.

In another embodiment, one or more awards are provided to one or more players in association with the determination of whether to trigger the group bonus event. In this embodiment, the determination of whether or not to trigger the group bonus event also includes a determination of any award to provide to the player of the actively played gaming device associated with the determination to trigger the group bonus event. In one example embodiment, one or more the unsuccessful outcomes of the symbols generators utilized in the group bonus event participation sequence are associated with an award, such as a value amount. In this example embodiment, if an unsuccessful outcome is generated and the generated unsuccessful outcome is associated with an award, that award is provided to the player that participated in the group bonus event participation sequence.

Evaluation Points

In one embodiment, the gaming system and method disclosed herein employs a point-based or ranking-based system to determine each individual player's eligibility to participate in a triggered group bonus event. In one such embodiment, a player's eligibility to participate in a triggered group bonus event is based on that player currently having a designated quantity of accumulated eligibility points when the group bonus event is triggered. For example, the designated quantity of eligibility points is one, such that when the group bonus event is triggered, any player with at least one eligibility point is qualified to participate in the triggered group bonus event. Accordingly, in this example, any player with at least one accumulated eligibility point at the time the group bonus event is triggered is considered as actively playing a gaming device in the gaming system and thus participates in the triggered group bonus event.

In one embodiment, the gaming system and method disclosed herein further employs the point-based or ranking-based system to scale each individual player's group bonus event award based on that individual player's gaming activity and/or wagering activity. In this embodiment, the point-based system accounts for each individual player's coin-in amount or wagers placed to provide that each individual player's group bonus event award (for a triggered group bonus event) is, on average, proportional to that individual player's coin-in amount.

Figure 7:
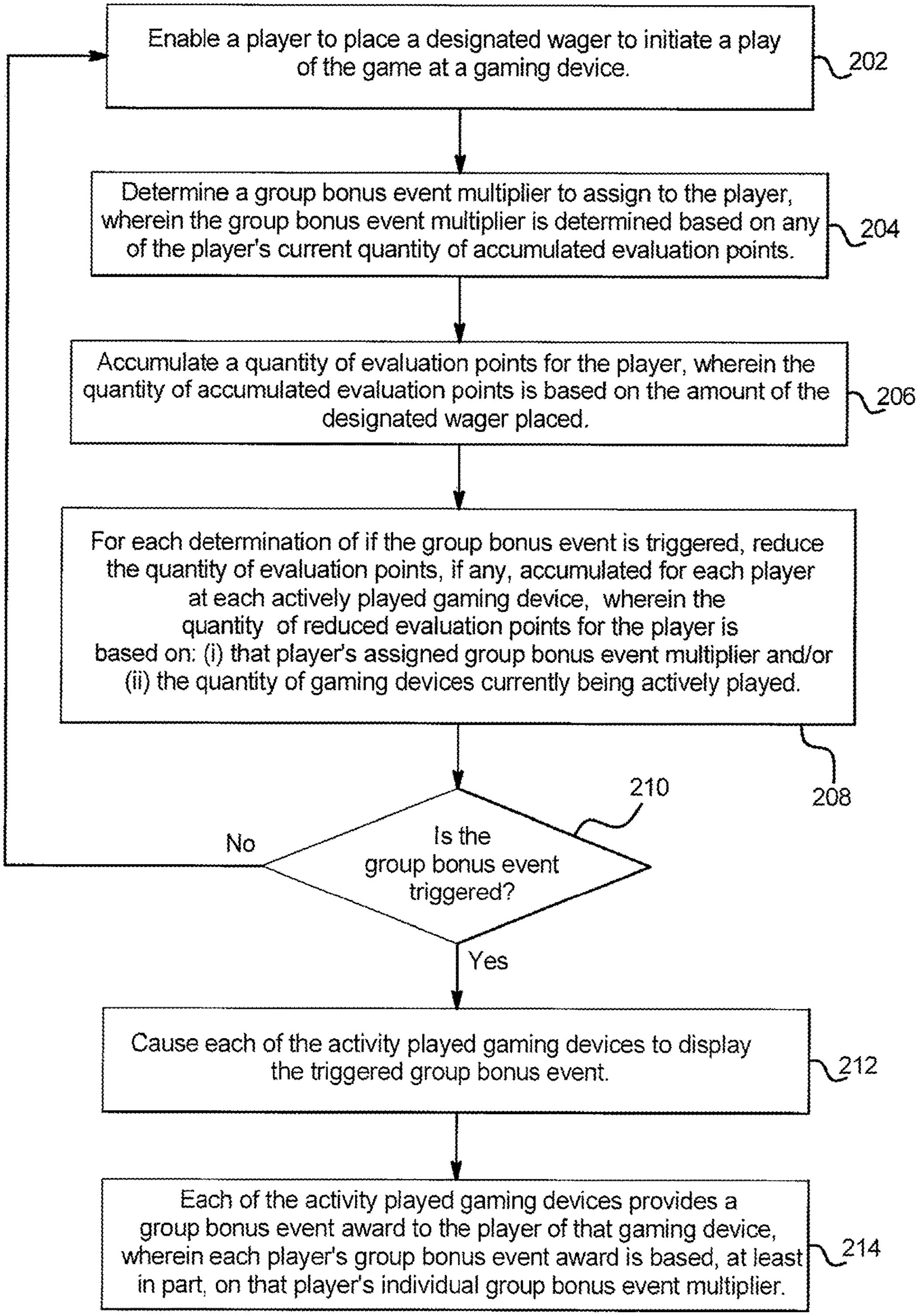
FIG. 7 is a flow-chart of one embodiment of the gaming system disclosed herein illustrating an accumulation of a quantity of evaluation points.

In operation of one embodiment, a gaming device enables a player to place a designated wager to initiate a play of a game at that gaming device as indicated in block 202 of FIG. 7. In one embodiment, the designated wager is a wager to initiate a play of a primary game. In another embodiment, the designated wager is a maximum wager to initiate a play of a primary game. In another embodiment, the designated wager is a side wager or side bet. It should be appreciated that any suitable wager amount or wager configuration may qualify as the designated wager.

After a player places a designated wager to play a game, as indicated in block 204 of FIG. 7, the central server determines a group bonus event multiplier to assign to or otherwise associate with the player, wherein the assigned group bonus event multiplier is determined based on any of the player's current quantity of accumulated evaluation points. In this embodiment, the group bonus event multiplier represents a multiplier for the player of any determined group bonus event award if the next determination of whether to trigger a group bonus event results in a triggering of the group bonus event. In one embodiment, different levels or ranges of accumulated evaluation points are associated with different group bonus event multipliers to be assigned to the player. For example, as seen in Table 1 below, different ranges of accumulated evaluation points equate to different assigned group bonus multipliers.

TABLE 1

| Accumulated Evaluation Points Range | Assigned Group Bonus Event Multiplier |
|---|---|
| 0-249 | 1X |
| 250-499 | 2X |
| 500-749 | 3X |
| 750-999 | 4X |
| 1000-1399 | 5X |
| 1400-1799 | 7X |
| 1800-2199 | 10X |
| 2200-2599 | 15X |
| 2600-2999 | 25X |
| >2999 | 35X |

After determining the group bonus event multiplier to assign to the player, the central server causes the player to accumulate a quantity of evaluation points, wherein the quantity of accumulated evaluation points is based on the amount of the designated wager placed as indicated in block 206 of FIG. 7. In other words, by accumulating a quantity of evaluation points, the gaming system causes a positive evaluation point meter event (or a positive group bonus meter event) to occur for that player. For example, if the quantity of evaluation points accumulated is based on the player placing a side wager (to activate the accumulation of evaluation points) and the amount of the player's primary game wager and the player placed the side wager and a primary game wager for a bet multiplier of one, the central server causes the player to accumulate one-hundred evaluation points in association with the play of the primary game. In another example, if the player placed the side wager (to activate the accumulation of evaluation points) and a primary game wager for a bet multiplier of two, the central server causes the player to accumulate two-hundred evaluation points in association with the play of the primary game. It should be appreciated that in one embodiment, each player's current balance of evaluation points is displayed to the player via one or more evaluation point meters or one or more group bonus meters.

In one embodiment, as indicated in block 208 of FIG. 7, for each determination of if the group bonus event is triggered, the gaming system reduces the quantity of evaluation points, if any, accumulated for each player at each actively played gaming device, wherein the quantity of reduced evaluation points for the player is based on: (i) that player's assigned group bonus event multiplier and/or (ii) the quantity of gaming devices currently being actively played. In other words, by reducing such players' quantity of evaluation points, the gaming system causes a negative evaluation point meter event (or a negative group bonus meter event) to occur for such players. It should be appreciated that in this embodiment, as each designated wager placed causes an accumulation of zero, one or more evaluation points for a specific player, each determination of whether to trigger the group bonus event also causes a reduction in one or more accumulated evaluation points for each active player. That is, since a triggering of the group bonus event at any of the actively played gaming devices in the gaming system causes a triggering of the group bonus event which will apply to each of the players at each of the actively played gaming devices, each time such a determination occurs (and each player at each actively played gaming device is given a chance to participate in the group bonus event) results in a reduction of each player's quantity of accumulated evaluation points. In other words, each determination of whether to trigger the group bonus event has the potential to trigger the group bonus event for each of the players at each actively played gaming device and thus each determination of whether to trigger the group bonus event causes a reduction of a quantity of evaluation points for each player in the group of actively played gaming devices. Accordingly, the faster a first player at a first gaming device in the gaming system plays the games of the first gaming device, the more frequent each determination of whether to trigger the group bonus event occurs and the greater quantity of evaluation points deducted from each player's evaluation point meter or account (as a direct result of the first player's greater rate of play).

In one embodiment, as mentioned above, the player's assigned group bonus event multiplier affects that player's quantity of reduced evaluation points. In this embodiment, a default or base quantity of evaluation points is modified by the group bonus event multiplier and the resulting quantity of evaluation points are decremented from the player's evaluation point meter or account. In one such embodiment, if the bonus event is triggered and the player is provided a group bonus event award that is multiplied by an applicable group bonus event multiplier, the quantity of reduced accumulated evaluation points for this multiplied group bonus event award would also be multiplied by the applicable group bonus event multiplier. In this embodiment, a player may be provided an increased group bonus event award in a triggered group bonus event, but the quantity of accumulated evaluation points used to participate in the group bonus event is increased as well. For example, if each determination of whether the group bonus is triggered reduces each player's accumulated quantity of evaluation points by a default or based quantity of ten evaluation points and a first player (at a first actively played gaming device in the gaming system) is assigned a first group bonus event multiplier of 1×, then each determination of whether to trigger the group bonus event will reduce the first player's quantity of accumulated evaluation points by ten evaluation points. In this example, if a second player (at a second actively played gaming device in the gaming system) is assigned a second group bonus event multiplier of 4×, then each determination of whether to trigger the group bonus event will reduce the second player's quantity of accumulated evaluation points by forty evaluation points. It should be appreciated that in this example, if the group bonus event is triggered, the second player's assigned group bonus event multiplier will cause the second player's group bonus event award to be four times the first player's group bonus event.

An example of this embodiment is illustrated in FIG. 8 in which the player's group bonus event multiplier affects the quantity of evaluation points reduced per determination of if the group bonus event is triggered. As seen in FIG. 8, the gaming system of this example includes one player actively playing a gaming device in the gaming system and betting one credit per line (such that each wager placed by the player also represents each determination for the gaming system of whether to trigger the group bonus event). In this example, as the player's quantity of accumulated evaluation points increases from the first group bonus event multiplier range to the second group bonus event multiplier range, the player's group bonus event multiplier increases accordingly. As the player's group bonus event multiplier increases, so does the quantity of evaluation points deducted from the player's evaluation point account or meter for each determination of whether or not the group bonus event will be triggered. It should be appreciated that in this example, at certain points in time, such as when the player's group bonus event multiplier is increased to 2×, the change in evaluation points from the player's wager on a game (i.e., the determination of whether to trigger the group bonus event) is a net loss in evaluation points. Such net loss in evaluation points leads to a reduced quantity of accumulated evaluation points and a reduced group bonus event multiplier (as the reduced quantity of accumulated evaluation points correlates to a lower group bonus event multiplier range).

In one embodiment, as mentioned above, the quantity of players actively playing the gaming devices in the gaming system affects the quantity of evaluation points used by each player for each determination of whether or not to trigger the group bonus event. In this embodiment, in the same manner as how the quantity of players actively playing the gaming devices affects the probability of each player triggering the group bonus event described above, the quantity of players actively playing the gaming devices in the gaming system also affects the quantity of evaluation points reduced for each player per determination of whether to trigger the group bonus event. For example, if twice as many gaming devices are being actively played and the central server determines that each actively played gaming device has half the individual probability of triggering the group bonus event (as described above), the central server also determines that each determination of whether to trigger the group bonus event will reduce each player's quantity of accumulated evaluation points by half as many evaluation points per determination. That is, if a player's individual chance of triggering the group bonus event is reduced, the quantity of reduced evaluation points for each determination (of whether to trigger the group bonus event) is also reduced accordingly. For example, as seen in Table 2 below, different numbers of actively played gaming devices equate to different quantities of evaluation points reduced from each player per determination of whether to trigger the group bonus event.

TABLE 2

| Number of Actively Played Gaming Devices | Reduction in Accumulated Evaluation Points for Each Determination to Trigger Group Bonus Event |
|---|---|
| 1 | 60 |
| 2 | 30 |
| 3 | 20 |
| 4 | 15 |
| 5 | 12 |

FIGS. 9A to 9C illustrates an example (from the perspective of one gaming device) which accounts for the different factors that influence each player's quantity of accumulated evaluation points. In this example, a first player at a first gaming device is placing a designated wager that is associated with earning two-hundred evaluation points per wager placed and three other players are each placing a respective wager at the same rate as the first player. As seen in FIGS. 9A to 9E, for every occurrence in which the first player earns a quantity of evaluation points (i.e., the player placing the designated wager and earning two-hundred evaluation points), three events occur in which the first player loses a quantity of evaluation points. That is, for each determination of whether to trigger the group bonus event that occurs in association with the first player, there are three determinations of whether to trigger the group bonus event that occur in association with the other players at the other gaming devices in the gaming system. As seen in this example and as described above, the first player's wager amount affects the quantity of evaluation points accumulated per wager placed, and each determination of whether or not to trigger a group bonus event (arising from any actively played gaming device in the gaming system) causes a reduction in each player's accumulated evaluation points, wherein the reduction in evaluation points for the first player is based on the first player's current group bonus event multiplier and the number of actively played gaming devices in the gaming system.

It should be appreciated that reducing each player's accumulated evaluation points based on activity that occurs at other gaming devices in the gaming system provides that a player's participation in any triggered group bonus event and the amount of that player's group bonus event multiplier are conditioned on that player's continued gaming activity. That is, reducing each player's accumulated evaluation points for each determination of whether to trigger a group bonus event (regardless of if that determination occurs in association with that player or not) provides that a first player who gains eligibility for a group bonus event and then waits for other players to continue playing (in hopes that these other players trigger the group bonus event for the first player) would lose eligibility to participate in the group bonus event and lose their group bonus event multiplier as they run out of evaluation points over a given period of time. For example, FIGS. 10A and 10B illustrates if a player has accumulated 2650 evaluation points and then stops betting while there are four other players actively playing gaming devices in the gaming system. The example of FIGS. 10A and 10B shows that after fifty-eight determinations of whether to trigger the group bonus event for each of the actively played gaming devices in the gaming system, the player would no longer be eligible to participate in a triggered group bonus event (i.e., not be considered actively playing the gaming device). In this example, since each game played by each player in the gaming system is a determination of whether to trigger the group bonus event, the fifty-eight determinations to trigger the group bonus event equates to the remaining four players playing roughly fourteen games each.

It should be further appreciated that configuring the gaming system such that the player's assigned group bonus event multiplier is not applied to the quantity of evaluation points provided per designated wager placed by that player but is applied to the quantity of evaluation points decremented from each player for every determination of whether or not to trigger the group bonus event provides a cap to the number of evaluation points a player may accumulate. Such a configuration further provides a cap to the amount of any group bonus event multiplier assigned to a player. That is, if a player is betting rapidly and builds up their evaluation points enough, the central server assigns the player a higher value group bonus event multiplier. However, as this higher value group bonus event multiplier also multiplies the number of points decremented for each determination of whether or not to trigger the group bonus event, it is possible for the group bonus event multiplier to reach such a value that the number of evaluation points that each determination reduces the player's quantity of accumulated evaluation points exceeds the maximum number of possible evaluation points the player may accumulate at any given point in time, thus leading to a net loss of evaluation points. Accordingly, the quantity of evaluation points a player may accumulate is capped and therefore the group bonus event multiplier assigned to the player is capped as well.

In addition to reducing the quantity of accumulated evaluation points for each player at each actively played gaming for each determination of whether to trigger the group bonus event, the gaming system disclosed herein also determines if the group bonus event is triggered as indicated in diamond 210 of FIG. 7 and as described above. In one embodiment, if the group bonus event is not triggered, the gaming system returns to block 202 of FIG. 7 and awaits a player to place another designated wager to initiate a play of a gaming device in the gaming system.

On the other hand, if the determination is that the group bonus event is triggered, as indicated in block 212 of FIG. 7 and described above, each of the actively played gaming device displays the triggered group bonus event. After triggering the group bonus event, each of the actively played gaming devices provides a group bonus event award to the player of that gaming device, wherein each player's group bonus event award is based, at least in part, on that player's individual group bonus event multiplier as indicated in block 214 of FIG. 7. For example, if the group bonus event is triggered, a group bonus event award of one-thousand credits is determined for each player that participated in the group bonus event and a first player (at a first actively played gaming device in the gaming system) is assigned a first group bonus event multiplier of 1×, the first player is displayed and provided a modified group bonus event award of one-thousand credits (i.e., one-thousand credit group bonus event award×1× assigned group bonus event multiplier). In this example, if a second player (at a second actively played gaming device in the gaming system) is assigned a second group bonus event multiplier of 4×, the second player is displayed and provided a modified group bonus event award of four-thousand credits (i.e., one-thousand credit group bonus event award×4× assigned group bonus event multiplier).

In one embodiment, after the group bonus event is triggered, the central server resets one, more or each player's quantity of accumulated evaluation points. In another embodiment, after the group bonus event is triggered, the central sever enables one, more or each of the players to keep all or some of that player's accumulated evaluation points. In different embodiments, the determination for one or more of the players to keep one or more evaluation points and/or the quantity, if any, of evaluation points that the each player may keep is predetermined, randomly determined, determined based on the player's status (such as determined through a player tracking system), determined based on a generated symbol or symbol combination, determined based on a random determination by the central controller, determined based on a random determination at the gaming device, determined based on one or more side wagers placed, determined based on one or more primary game wagers placed, determined based on time (such as the time of day), determined by the game operator or gaming establishment or determined based on any other suitable method or criteria.

In another embodiment, when a group bonus event is triggered, each player's accumulated evaluation points are zeroed out and they are each awarded an additional award based on the amount of their accumulated evaluation points. In another embodiment, if a player has accumulated a quantity of evaluation points and decides to leave the gaming device before the group bonus event is triggered, the gaming system enables the player to cash out their accumulated evaluation points for an award. It should be appreciated that in this embodiment, a player leaving the gaming device is different than a player staying at a gaming device and losing evaluation points due to inactivity as described above.

In one alternative embodiment, the central server determines a group bonus event multiplier to assign to the player based on the player's current quantity of accumulated evaluation points and one or more additional factors or criteria associated with: (i) one or more plays of one or more primary games at one or more of the gaming devices, (ii) one or more plays of one or more secondary games at one or more of the gaming devices, and/or (iii) one or more occurrences at one or more of the gaming devices which are independent of any primary or secondary games played. In different embodiments, such additional factors or criteria are predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on the player's primary game wager, determined based on time (such as the time of day), determined based on an amount of coin-in accumulated in one or more pools or determined based on any other suitable method or criteria.

It should thus be appreciated that in one embodiment, the gaming system disclosed herein includes a plurality of gaming devices, and at least one controller configured to communicate with each of the gaming devices. Upon a communication of a wager event at a first one of the gaming devices, the at least one controller is programmed to: determine a positive group bonus meter event to be applied to a group bonus meter associated with the first one of the gaming devices, determine a negative group bonus meter event to be applied to a group bonus meter associated with a second one of the gaming devices, and determine if a group bonus event is triggered. If it is determined that the group bonus event has been triggered, the at least one controller is programmed to: determine, based on the group bonus meter associated with the first one of the gaming devices, if the first one of the gaming devices is eligible for participation in the triggered group bonus event, determine, based on the group bonus meter associated with the second one of the gaming devices, if the second one of the gaming devices is eligible for participation in the triggered group bonus event, cause each of the determined eligible gaming devices to display an indication of the gaming device's participation in the group bonus event, cause each of the determined eligible gaming devices to display a group bonus event award to be provided by the gaming device, and cause each of the determined eligible gaming devices to provide the displayed group bonus event award.

In one alternative embodiment, the central server causes the player to accumulate a quantity of evaluation points, wherein the quantity of accumulated evaluation points is based on the amount of the designated wager placed and one or more additional factors or criteria associated with: (i) one or more plays of one or more primary games at one or more of the gaming devices, (ii) one or more plays of one or more secondary games at one or more of the gaming devices, and/or (iii) one or more occurrences at one or more of the gaming devices which are independent of any primary or secondary games played. In different embodiments, such additional factors or criteria are predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on the player's primary game wager, determined based on time (such as the time of day), determined based on an amount of coin-in accumulated in one or more pools or determined based on any other suitable method or criteria.

In another alternative embodiment, the central server causes the player to accumulate a quantity of evaluation points, wherein the quantity of accumulated evaluation points is based on the quantity of gaming devices currently being actively played and one or more additional factors or criteria associated with: (i) one or more plays of one or more primary games at one or more of the gaming devices, (ii) one or more plays of one or more secondary games at one or more of the gaming devices, and/or (iii) one or more occurrences at one or more of the gaming devices which are independent of any primary or secondary games played. In different embodiments, such additional factors or criteria are predetermined, randomly determined, determined based on the player's status (such as determined through a player tracking system), determined based on a generated symbol or symbol combination, determined based on a random determination by the central controller, determined based on a random determination at the gaming machine, determined based on time (such as the time of day), determined based on an amount of coin-in accumulated in one or more pools or determined based on any other suitable method or criteria.

In another alternative embodiment, the central server causes the player to accumulate a quantity of evaluation points, wherein the quantity of accumulated evaluation points is based on the amount of that player's designated wager placed, the quantity of gaming devices currently being actively played and one or more additional factors or criteria associated with: (i) one or more plays of one or more primary games at one or more of the gaming devices, (ii) one or more plays of one or more secondary games at one or more of the gaming devices, and/or (iii) one or more occurrences at one or more of the gaming devices which are independent of any primary or secondary games played. In different embodiments, such additional factors or criteria are predetermined, randomly determined, determined based on the player's status (such as determined through a player tracking system), determined based on a generated symbol or symbol combination, determined based on a random determination by the central controller, determined based on a random determination at the gaming machine, determined based on one or more side wagers placed, determined based on time (such as the time of day), determined based on an amount of coin-in accumulated in one or more pools or determined based on any other suitable method or criteria.

In another embodiment, the gaming system disclosed herein enables each player to pick whether they wish to participate in a group bonus event or to participate in an individual bonus event. If the player opts out of the group bonus event and decides to participate alone in an individual bonus event, the gaming system would divide the group of gaming devices into a general group (to participate in the group bonus event described above) and one or more other groups consisting of one player each (to each participate in their own individual bonus event). In this embodiment, the group bonus event features described above would be applicable for the gaming devices in the group and inapplicable for the gaming devices that opt out of the group.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A gaming system comprising:

a plurality of gaming devices; and at least one controller configured to communicate with each of the gaming devices, wherein upon a communication of a wager event at a first one of said gaming devices, the at least one controller is programmed to:

(a) determine a positive group bonus meter event to be applied to a group bonus meter associated with the first one of said gaming devices;

(b) determine a negative group bonus meter event to be applied to a group bonus meter associated with a second one of said gaming devices;

(c) determine if a group bonus event is triggered; and (d) if it is determined that the group bonus event has been triggered:

(i) determine, based on the group bonus meter associated with the first one of said gaming devices, if the first one of said gaming devices is eligible for participation in the triggered group bonus event;

(ii) determine, based on the group bonus meter associated with the second one of said gaming devices, if the second one of said gaming devices is eligible for participation in the triggered group bonus event;

(iii) cause each of said determined eligible gaming devices to display an indication of said gaming device's participation in said group bonus event;

(iv) cause each of said determined eligible gaming devices to display a group bonus event award to be provided by said gaming device; and (v) cause each of said determined eligible gaming devices to provide the displayed group bonus event award.

2. The gaming system of claim 1, wherein the positive group bonus meter event to be applied to the group bonus meter associated with the first one of said gaming devices is based on an amount of a wager placed on a play of a game of said first one of said gaming devices.

3. The gaming system of claim 1, wherein the negative group bonus meter event to be applied to the group bonus meter associated with the second one of said gaming devices is based, at least in part, on a quantity of said gaming devices which have communicated a wager event within a predefined period of time.

4. The gaming system of claim 1, wherein the negative group bonus meter event to be applied to the group bonus meter associated with the second one of said gaming devices is based, at least in part, on a group bonus event multiplier currently assigned to the second one of the gaming devices.

5. The gaming system of claim 4, wherein the group bonus event multiplier currently assigned to the second one of the gaming devices is based on the group bonus meter associated with the second one of said gaming devices.

6. The gaming system of claim 4, wherein if the group bonus event is triggered, for each of said determined eligible gaming devices, the at least one controller is programmed to determine the group bonus event award based on a group bonus event multiplier currently assigned to said determined eligible gaming device.

* * * * *